(12) United States Patent
Lai

(10) Patent No.: US 11,705,499 B2
(45) Date of Patent: Jul. 18, 2023

(54) SEMICONDUCTOR DEVICE WITH INVERTER AND METHOD FOR FABRICATING THE SAME

(71) Applicant: NANYA TECHNOLOGY CORPORATION, New Taipei (TW)

(72) Inventor: Chun-Chi Lai, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 183 days.

(21) Appl. No.: 17/345,915

(22) Filed: Jun. 11, 2021

(65) Prior Publication Data
US 2022/0399453 A1 Dec. 15, 2022

(51) Int. Cl.
| H01L 29/45 | (2006.01) |
| H01L 23/528 | (2006.01) |
| H03K 19/20 | (2006.01) |
| H01L 21/285 | (2006.01) |
| H01L 29/66 | (2006.01) |
| H01L 29/78 | (2006.01) |

(52) U.S. Cl.
CPC ........ *H01L 29/45* (2013.01); *H01L 21/28518* (2013.01); *H01L 23/5286* (2013.01); *H01L 29/66492* (2013.01); *H01L 29/7835* (2013.01); *H03K 19/20* (2013.01)

(58) Field of Classification Search
None
See application file for complete search history.

(56) References Cited

U.S. PATENT DOCUMENTS

| 2006/0102965 A1 | 5/2006 | Ito et al. |
| 2006/0115944 A1* | 6/2006 | Kwak ................. H01L 27/0688 257/E27.026 |
| 2007/0096144 A1* | 5/2007 | Kapoor ................. H01L 27/098 257/256 |
| 2009/0057727 A1* | 3/2009 | Kapoor ................. H01L 29/808 257/256 |
| 2010/0013519 A1* | 1/2010 | Yoshii .................... H03K 19/20 326/112 |

(Continued)

FOREIGN PATENT DOCUMENTS

| TW | 201021189 A | 6/2010 |
| TW | 201435999 A | 9/2014 |
| TW | 201507159 A | 2/2015 |

*Primary Examiner* — Khaja Ahmad
(74) *Attorney, Agent, or Firm* — Muncy, Geissler, Olds & Lowe, P.C.

(57) ABSTRACT

The present application discloses a semiconductor device with an inverter and a method for fabricating the semiconductor device. The semiconductor device includes a substrate; a gate structure positioned on the substrate; a first impurity region and a second impurity region respectively positioned on two sides of the gate structure and positioned in the substrate; a first contact positioned on the first impurity region and including a first resistance; a second contact positioned on the first impurity region and including a second resistance less than the first resistance of the first contact. The first contact is configured to electrically couple to a power supply and the second contact is configured to electrically couple to a signal output. The gate structure, the first impurity region, the second impurity region, the first contact, and the second contact together configure an inverter.

20 Claims, 28 Drawing Sheets

(56) References Cited

U.S. PATENT DOCUMENTS

2010/0066430 A1* 3/2010 Siprak .................. H01L 21/761
                                                      327/379
2014/0084386 A1* 3/2014 Takeda .............. H01L 29/66462
                                                      257/408

* cited by examiner

SEMICONDUCTOR DEVICE WITH INVERTER AND METHOD FOR FABRICATING THE SAME

TECHNICAL FIELD

The present disclosure relates to a semiconductor device and a method for fabricating the semiconductor device, and more particularly, to a semiconductor device with an inverter and the method for fabricating the semiconductor device with the inverter.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a gate structure positioned on the substrate; a first impurity region and a second impurity region respectively positioned on two sides of the gate structure and positioned in the substrate; a first contact positioned on the first impurity region and including a first resistance; a second contact positioned on the first impurity region and including a second resistance less than the first resistance of the first contact. The first contact is configured to electrically couple to a power supply and the second contact is configured to electrically couple to a signal output. The gate structure, the first impurity region, the second impurity region, the first contact, and the second contact together configure an inverter.

In some embodiments, the first contact includes titanium nitride or doped polycrystalline silicon.

In some embodiments, the second contact includes tungsten.

In some embodiments, the semiconductor device includes a barrier layer positioned between the second contact and the first impurity region and positioned on a sidewall of the second contact. The barrier layer includes tungsten nitride.

In some embodiments, a width of the first contact is less than a width of the second contact.

In some embodiments, the semiconductor device includes a third contact positioned on the second impurity region. The third contact includes tungsten. The third contact is configured to electrically couple to a ground potential.

In some embodiments, the semiconductor device includes a gate contact positioned on the gate structure. The gate contact includes tungsten. The gate contact is configured to electrically couple to a signal input.

In some embodiments, the semiconductor device includes an assistance layer positioned between the first contact and the first impurity region. The assistance layer includes titanium silicide, nickel silicide, nickel platinum silicide, tantalum silicide, or cobalt silicide.

In some embodiments, the semiconductor device includes a plurality of gate spacers on the substrate and positioned on the two sides of the gate structure. The plurality of gate spacers include silicon nitride, silicon oxide, silicon oxynitride, or silicon nitride oxide.

In some embodiments, the semiconductor device includes a plurality of lightly doped regions positioned in the substrate and under the plurality of gate spacers. The plurality of lightly doped regions are doped with phosphorus, arsenic, antimony, or boron.

In some embodiments, a width of the first impurity region is greater than a width of the second impurity region.

In some embodiments, the gate structure includes a gate insulation layer positioned on the substrate and a gate bottom conductive layer positioned on the gate insulation layer. The gate contact is positioned on the gate bottom conductive layer.

In some embodiments, the semiconductor device includes a gate top conductive layer positioned between the gate contact and the gate bottom conductive layer. The gate top conductive layer includes titanium silicide, nickel silicide, nickel platinum silicide, tantalum silicide, or cobalt silicide.

In some embodiments, a sidewall of the first contact is substantially vertical.

In some embodiments, the semiconductor device includes a capping layer positioned on the substrate and covering the gate structure.

In some embodiments, a sidewall of the first contact is tapered.

In some embodiments, the semiconductor device includes a well layer positioned in the substrate. The first impurity region and the second impurity region are positioned in the well layer.

In some embodiments, the semiconductor device includes a buried insulation layer positioned in the substrate. The first impurity region and the second impurity region are positioned above the buried insulation layer.

Another aspect of the present disclosure provides a method for fabricating a semiconductor device including providing a substrate; forming a gate structure on the substrate; forming a first impurity region and a second impurity region respectively on two sides of the gate structure and in the substrate; forming a first contact on the first impurity region and including a first resistance; and forming a second contact on the first impurity region and including a second resistance less than the first resistance of the first contact. The first contact is configured to electrically couple to a power supply and the second contact is configured to electrically couple to a signal output. The gate structure, the first impurity region, the second impurity region, the first contact, and the second contact together configure an inverter.

In some embodiments, the first contact includes titanium nitride or doped polycrystalline silicon and the second contact includes tungsten.

Due to the design of the semiconductor device of the present disclosure, an inverter may be simply implemented using the first contact having high resistance. The compact design for implementing the inverter can save real estate of the semiconductor device. As a result, the cost of manufacturing the semiconductor device may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
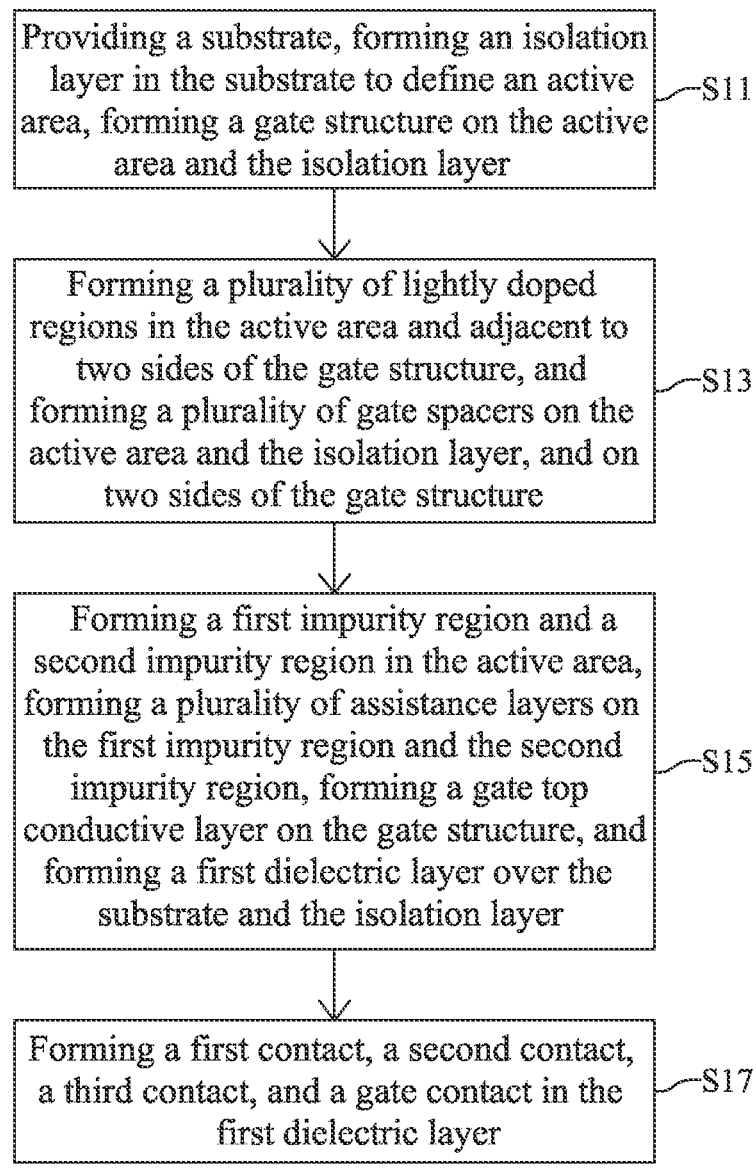
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
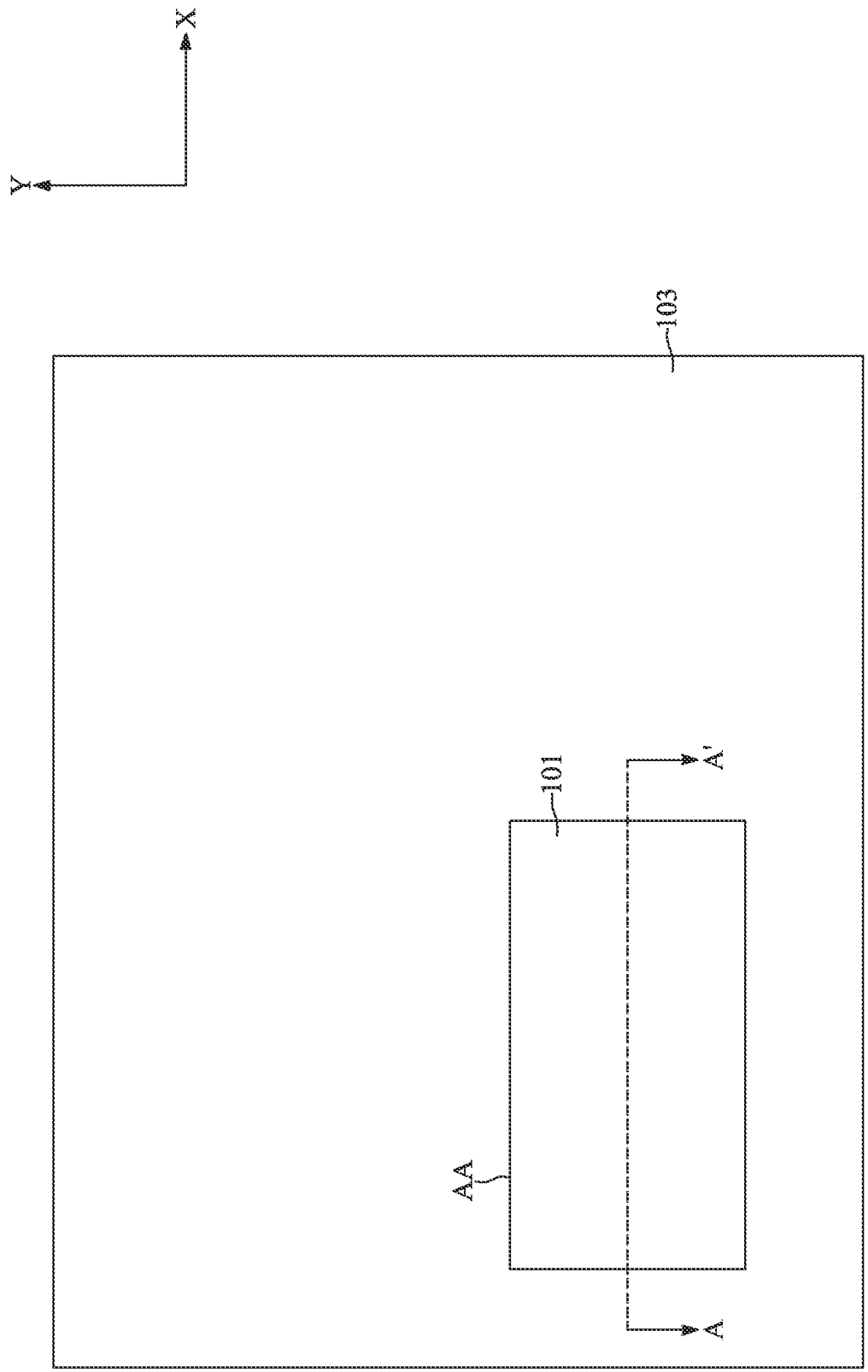
FIG. 2 illustrates, in a schematic top-view diagram, an intermediate semiconductor device in accordance with one embodiment of the present disclosure.
Figure 3:
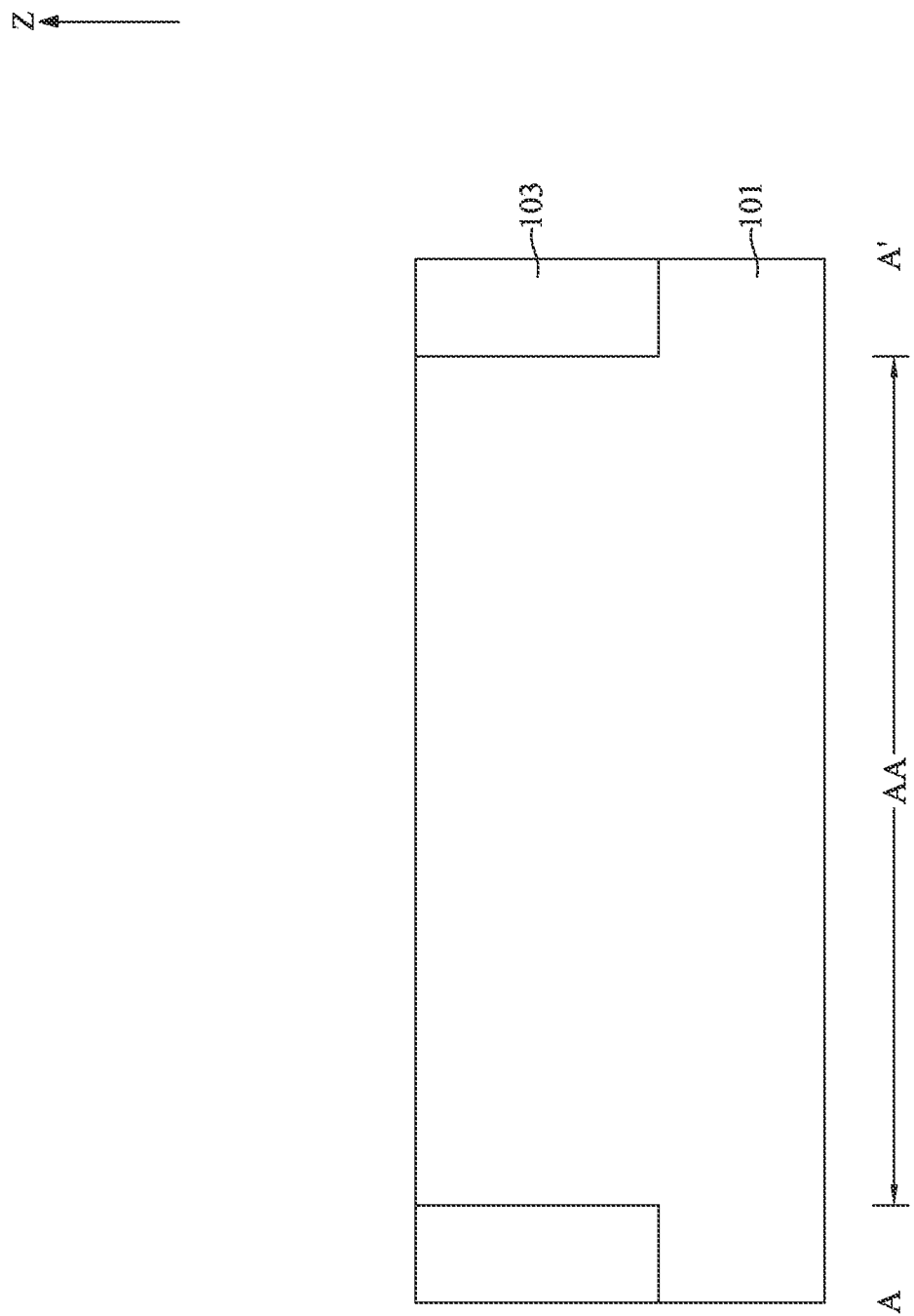
FIG. 3 is a schematic cross-sectional view diagram taken along a line A-A' in FIG. 2.
Figure 4:
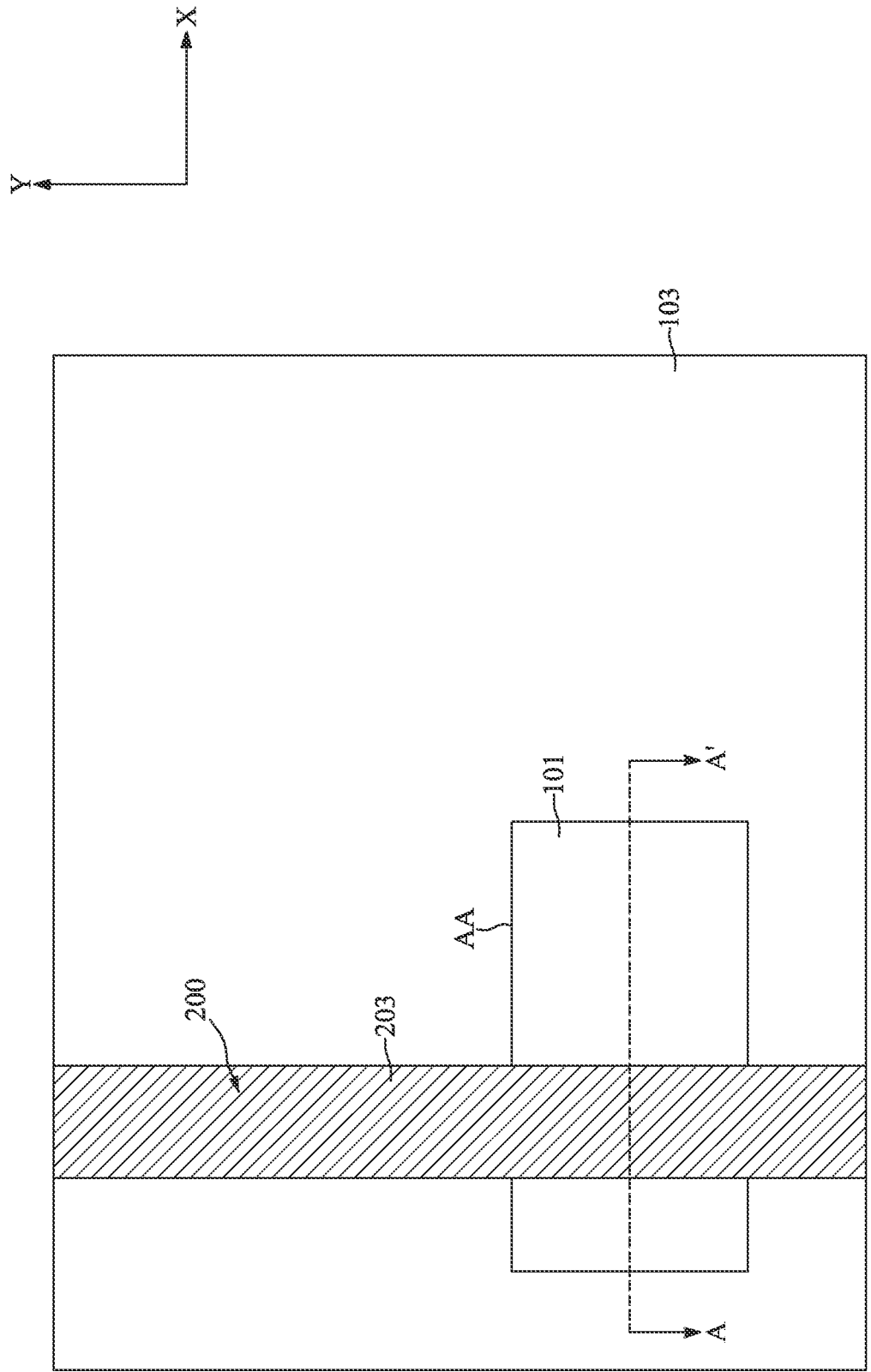
FIG. 4 illustrates, in a schematic top-view diagram, an intermediate semiconductor device in accordance with one embodiment of the present disclosure.
Figure 5:
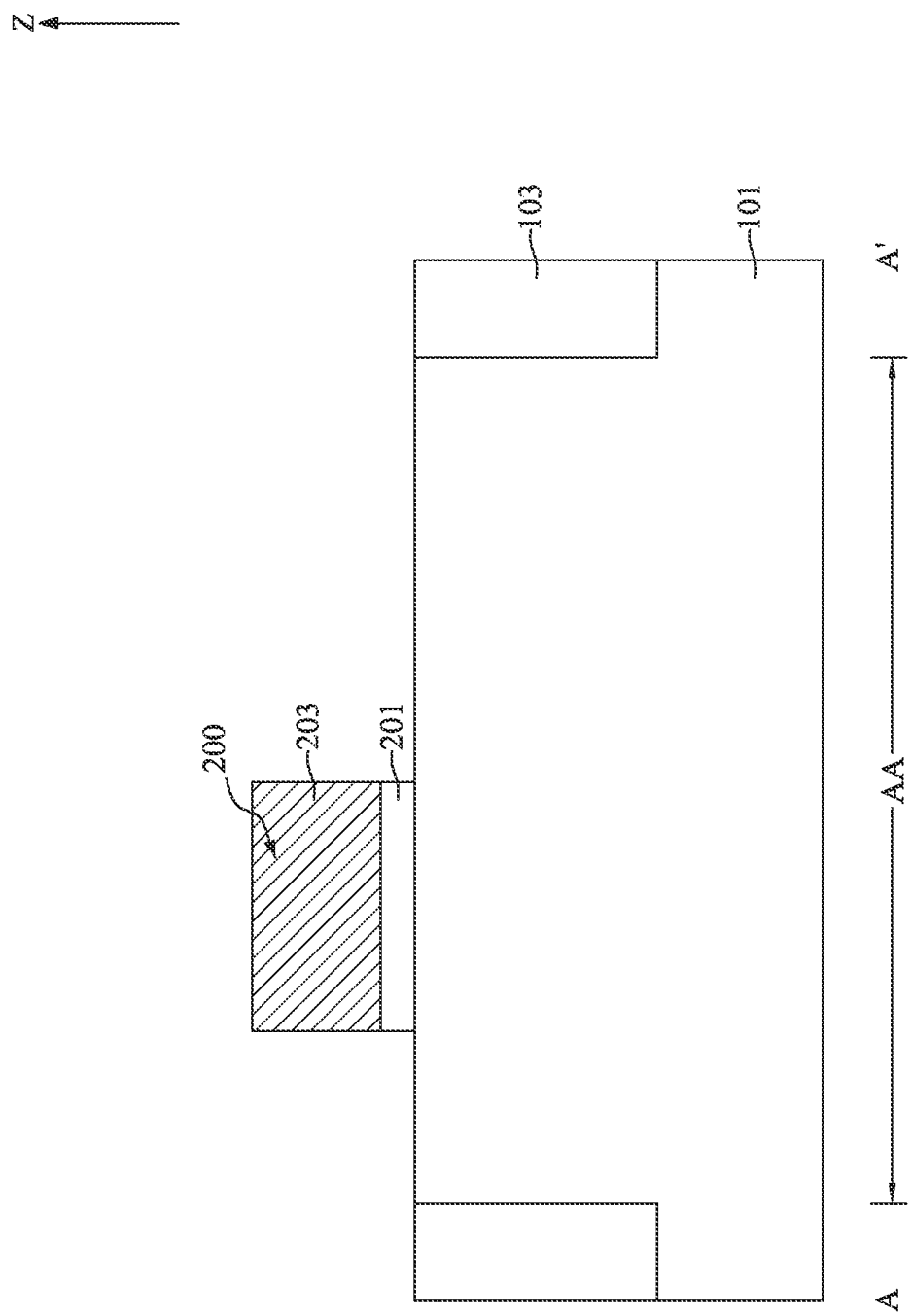
FIG. 5 is a schematic cross-sectional view diagram taken along a line A-A' in FIG. 4.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along a line A-A' in FIG. 2. FIG. 4 illustrates, in a schematic top-view diagram, an intermediate semiconductor device in accordance with one embodiment of the present disclosure. FIG. 5 is a schematic cross-sectional view diagram taken along a line A-A' in FIG. 4.

With reference to FIGS. 1 to 5, at step S11, a substrate 101 may be provided, an isolation layer 103 may be formed in the substrate 101 to define an active area AA, a gate structure 200 maybe formed on the active area AA and the isolation layer 103.

With reference to FIGS. 2 and 3, the substrate 101 may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

With reference to FIGS. 2 and 3, a series of deposition processes may be performed to deposit a pad oxide layer (not shown) on the substrate 101 and a pad nitride layer (not shown) on the pad oxide layer. The pad oxide layer may be formed of, for example, silicon oxide. The pad nitride layer may be formed of, for example, silicon nitride. A photolithography process may be performed to form a mask layer on the pad nitride layer. The mask layer may be a photoresist layer and may define the position and pattern of the isolation layer 103.

With reference to FIGS. 2 and 3, an etch process, such as an anisotropic dry etch process, may be performed to remove the pad oxide layer, the pad nitride layer, and the substrate 101 not covered by the mask layer so as to form a recess extending to the substrate 101. After the etch process, the mask layer may be removed. An insulating material may be deposited to fill the recess, and a planarization process, such as chemical mechanical polishing, may be subsequently performed to remove excess filling material until the remained substrate 101 is exposed and concurrently form the isolation layer 103. The insulating material may be, for example, silicon oxide, silicon nitride, silicon oxynitride, silicon nitride oxide, or fluoride-doped silicate. The remained substrate 101 may be regarded as the active area AA.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

It should be noted that, in the description of the present disclosure, the active area AA may comprise a portion of the substrate 101 and spaces above and under the portion of the substrate 101. Describing an element as being disposed on the active area AA means that the element is disposed on a top surface of the portion of the substrate 101. Describing an element as being disposed in the active area AA means that the element is disposed in the portion of the substrate 101; however, a top surface of the element may be even with the top surface of the portion of the substrate 101. Describing an element as being disposed above the active area AA means that the element is disposed above the top surface of the portion of the substrate 101.

With reference to FIGS. 4 and 5, a layer of insulation material (not shown) may be formed to cover the active area AA and the isolation layer 103. A layer of conductive material (not shown) may be sequentially formed on the layer of insulation material. In some embodiments, the layer of insulation material may be formed by a deposition process such as chemical vapor deposition, plasma enhanced chemical vapor deposition, or the like. The layer of insulation material may have a thickness between about 0.5 nm and about 5.0 nm. Preferably, the thickness of the layer of insulation material may be between about 0.5 nm to about 2.5 nm. It should be noted that, the thickness of the layer of insulation material may be set to an arbitrary range depending on the circumstances.

In some embodiments, the insulation material may be, for example, silicon oxide. In some embodiments, the insulation material may, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof.

Specifically, the insulation material may be hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof. In some embodiments, the layer of insulation material may be a multilayer structure that includes, for example, one layer of silicon oxide and another layer of high-k dielectric material.

In some embodiments, the layer of conductive material may be formed by a deposition process such as chemical vapor deposition, plasma enhanced chemical vapor deposition, sputtering, or other suitable technique. The conductive material may be, for example, polycrystalline silicon, polycrystalline silicon germanium, or a combination thereof. In some embodiments, the conductive material may be, for example, copper, tungsten, aluminum, or other suitable conductive metal. A mask layer (not shown) may be formed on the layer of conductive material. The mask layer may be, for example, a photoresist layer. The mask layer may define the position and pattern of the gate structure 200.

With reference to FIGS. 4 and 5, an etch process, such as an anisotropic dry etch process, may be performed to remove portions of the layer of insulation material and the layer of conductive material. After the etch process, the remained portions of the layer of insulation material and the layer of conductive material may be respectively turned into a gate insulation layer 201 and a gate bottom conductive layer 203. The gate insulation layer 201 and the gate bottom conductive layer 203 together configure the gate structure 200.

Figure 6:
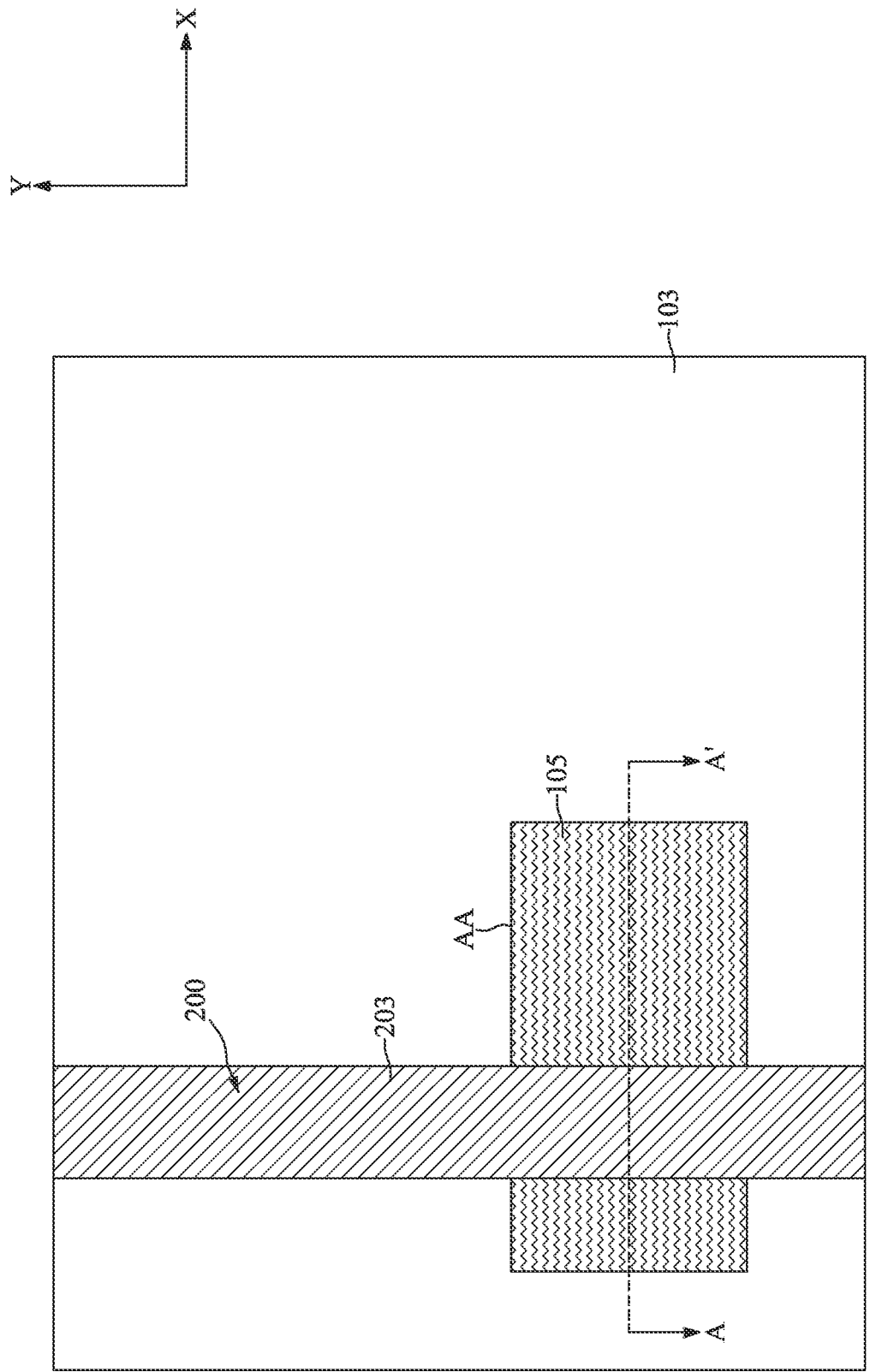
FIG. 6 illustrates, in a schematic top-view diagram, an intermediate semiconductor device in accordance with one embodiment of the present disclosure.
Figure 7:
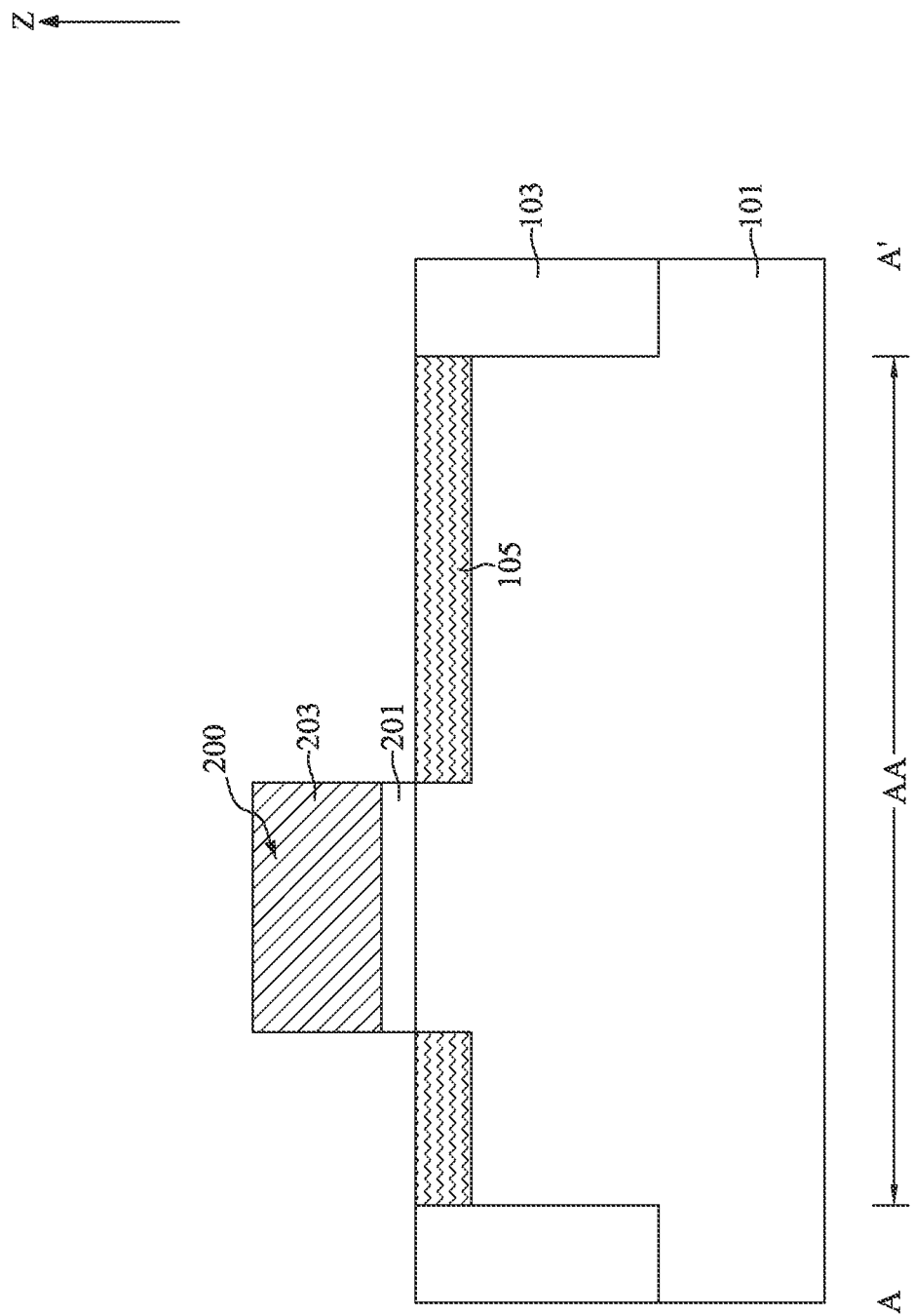
FIG. 7 is a schematic cross-sectional view diagram taken along a line A-A' in FIG. 6.
Figure 8:
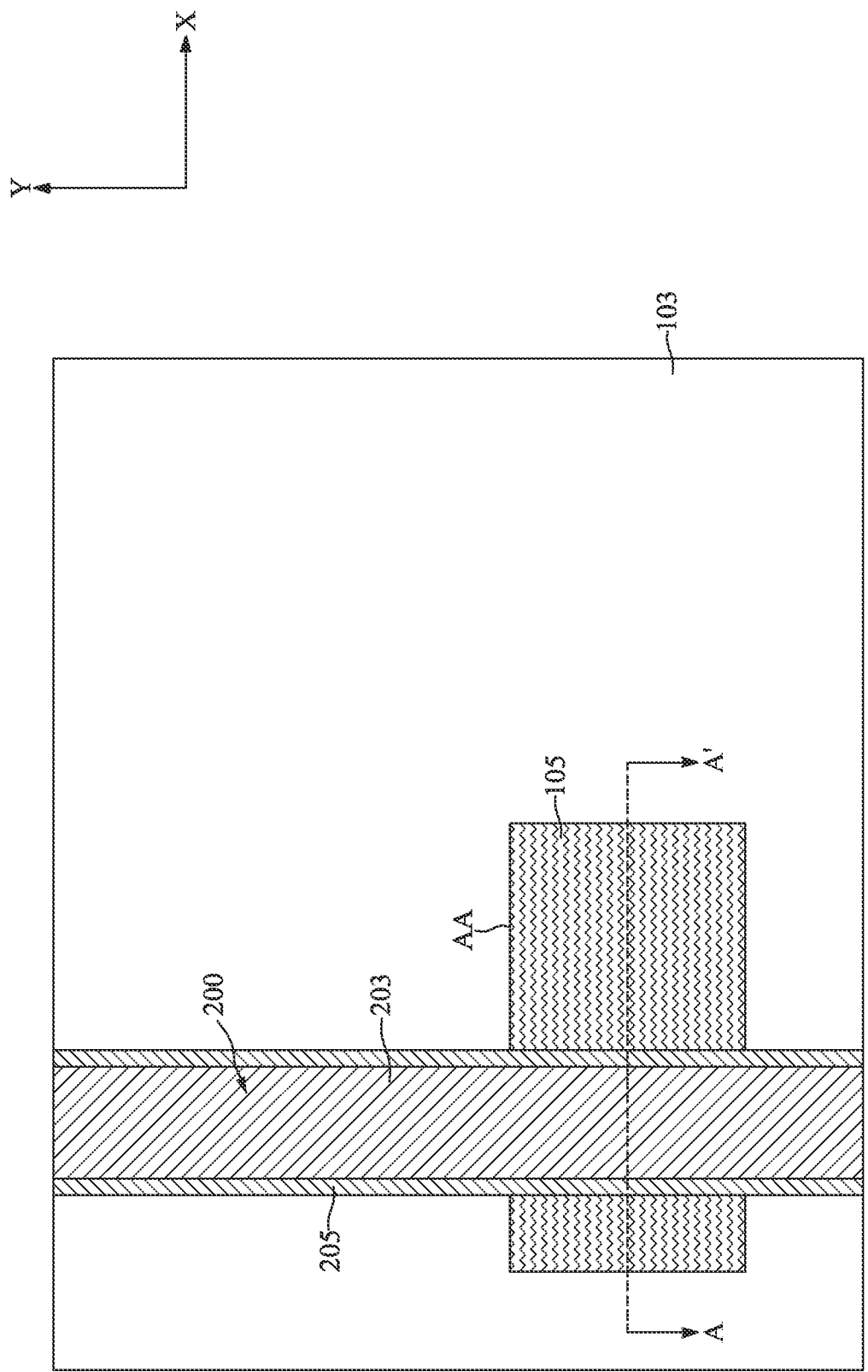
FIG. 8 illustrates, in a schematic top-view diagram, an intermediate semiconductor device in accordance with one embodiment of the present disclosure.
Figure 9:
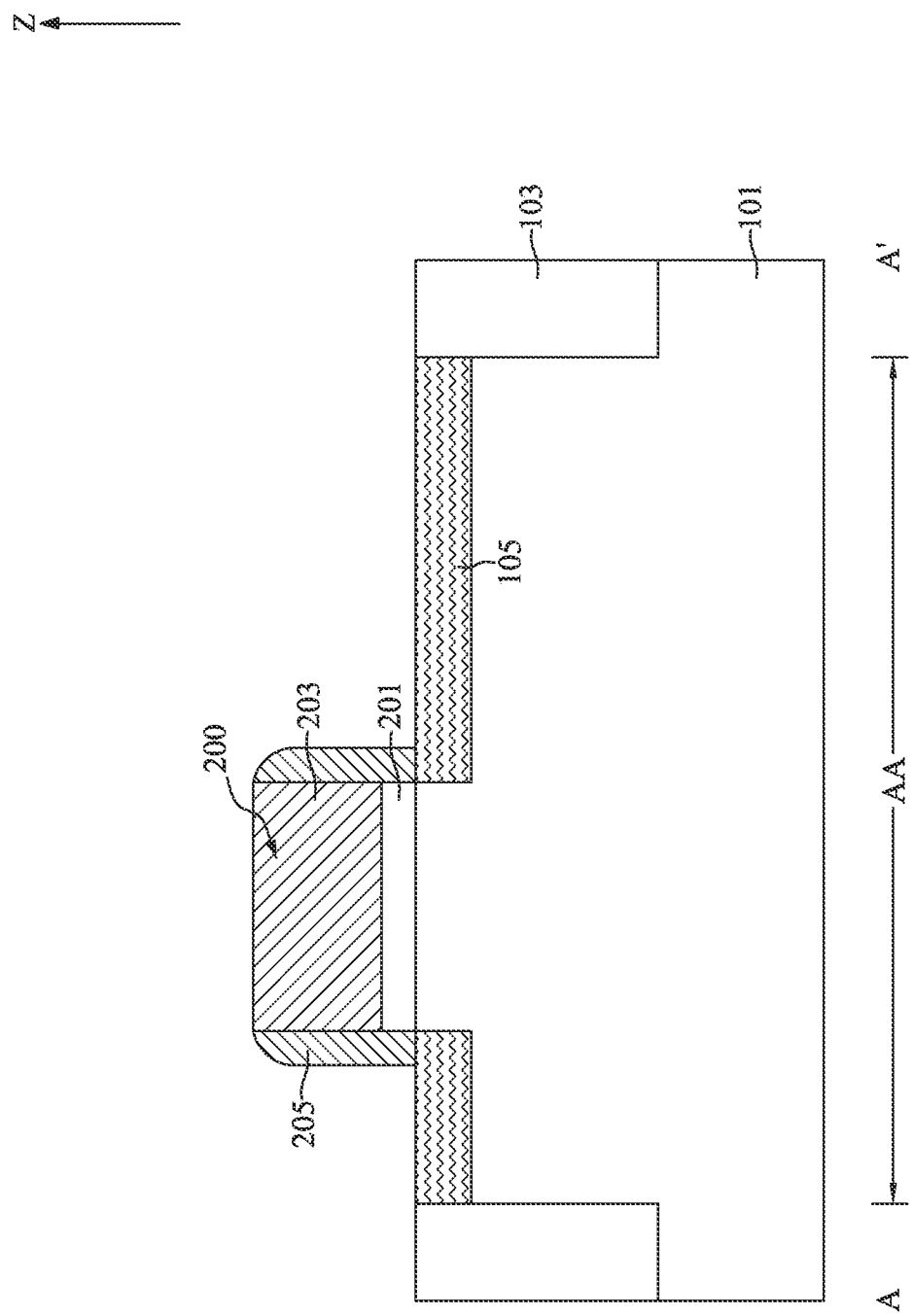
FIG. 9 is a schematic cross-sectional view diagram taken along a line A-A' in FIG. 8.

FIG. 6 illustrates, in a schematic top-view diagram, an intermediate semiconductor device in accordance with one embodiment of the present disclosure. FIG. 7 is a schematic cross-sectional view diagram taken along a line A-A' in FIG. 6. FIG. 8 illustrates, in a schematic top-view diagram, an intermediate semiconductor device in accordance with one embodiment of the present disclosure. FIG. 9 is a schematic cross-sectional view diagram taken along a line A-A' in FIG. 8.

With reference to FIG. 1 and FIGS. 6 to 9, at step S13, a plurality of lightly doped regions 105 may be formed in the active area AA and adjacent to two sides of the gate structure 200, and a plurality of gate spacers 205 may be formed on the active area AA and the isolation layer 103, and on two sides of the gate structure 200.

With reference to FIGS. 6 and 7, an implantation process may be performed using the gate structure 200 as a mask to form the plurality of lightly doped regions 105. The dopants of the implantation process may include p-type impurities (dopants) or n-type impurities (dopants). The p-type impurities may be added to an intrinsic semiconductor to create deficiencies of valence electrons. In a silicon-containing substrate, examples of p-type dopants, i.e., impurities include but are not limited to boron, aluminum, gallium, and indium. The n-type impurities may be added to an intrinsic semiconductor to contribute free electrons to the intrinsic semiconductor. In a silicon-containing substrate, examples of n-type dopants, i.e., impurities, include but are not limited to antimony, arsenic, and phosphorous.

An annealing process may be performed to activate the plurality of lightly doped regions 105. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal. The plurality of lightly doped regions 105 may reduce hot carrier effect during the operation of the semiconductor device 1A.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIGS. 8 and 9, a layer of insulation material may be conformally formed over the intermediate semiconductor device illustrated in FIG. 7. The layer of insulation material may be formed by, for example, chemical vapor deposition, plasma enhanced chemical vapor deposition, or the like. The insulation material may be, for example, silicon nitride, silicon oxide, silicon oxynitride, silicon nitride oxide, the like, or a combination thereof. An etch process, such as an anisotropic dry etch process, may be performed to remove portions of the layer of insulation material and concurrently form the plurality of gate spacers 205. The plurality of gate spacers 205 may be formed on the plurality of lightly doped regions 105.

Figure 10:
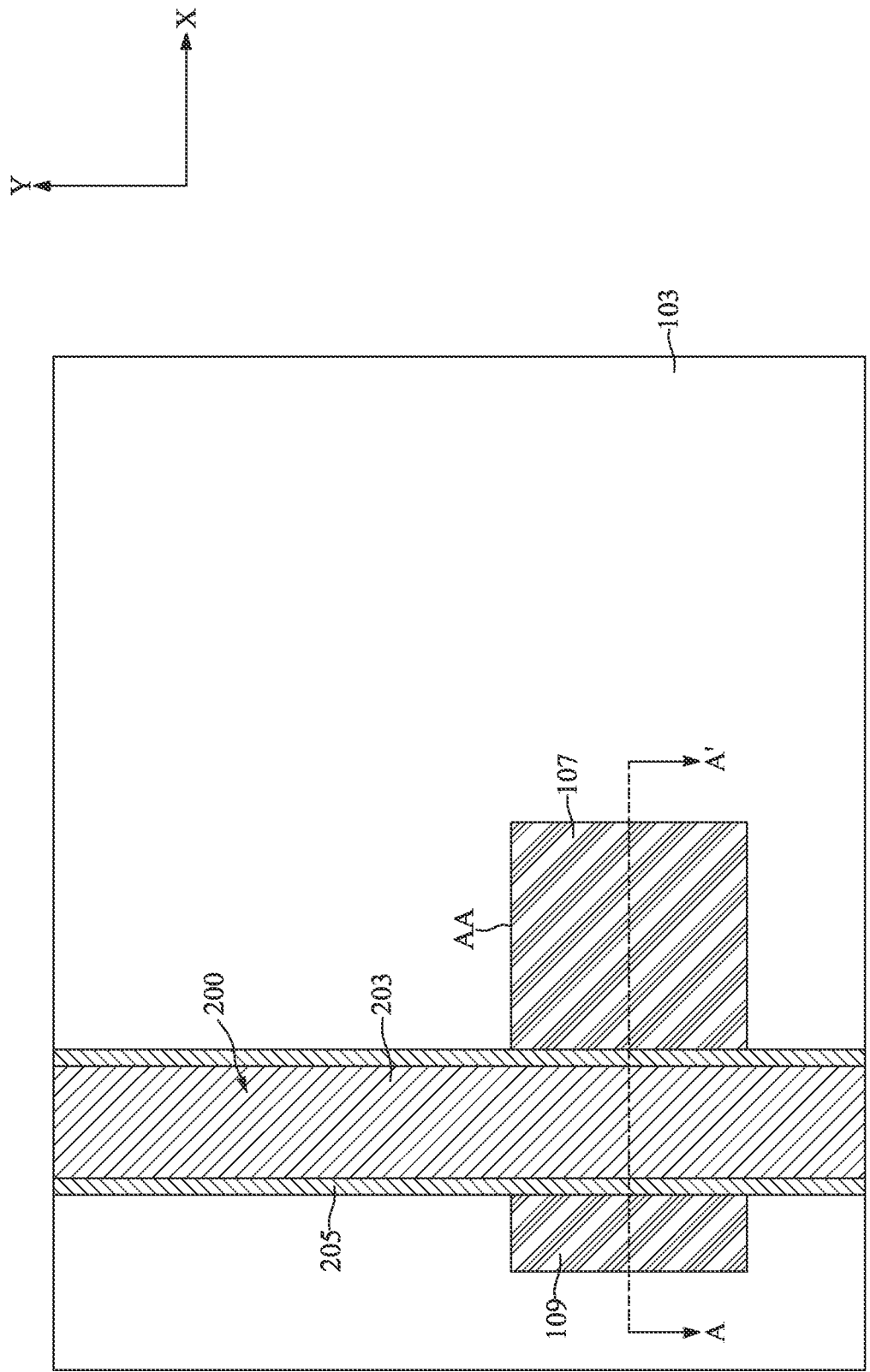
FIG. 10 illustrates, in a schematic top-view diagram, an intermediate semiconductor device in accordance with one embodiment of the present disclosure.
Figure 11:
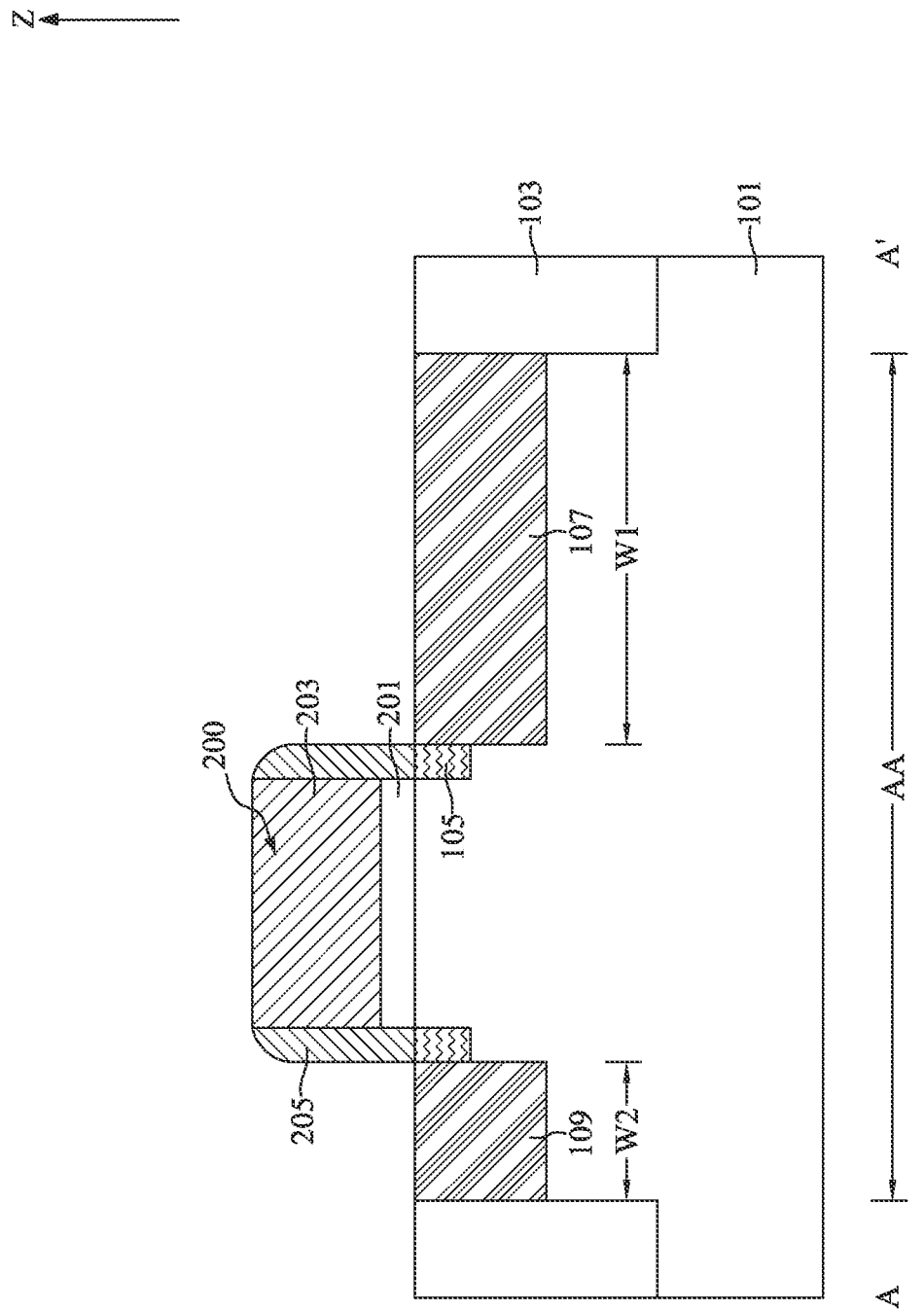
FIG. 11 is a schematic cross-sectional view diagram taken along a line A-A' in FIG. 10.

FIG. 10 illustrates, in a schematic top-view diagram, an intermediate semiconductor device in accordance with one embodiment of the present disclosure. FIG. 11 is a schematic cross-sectional view diagram taken along a line A-A' in FIG. 10. FIGS. 12 to 18 are schematic cross-sectional view diagrams taken along the line A-A' in FIG. 10 illustrating part of a flow for fabricating the semiconductor device 1A in accordance with one embodiment of the present disclosure.

With reference to FIG. 1 and FIGS. 10 to 13, at step S15, a first impurity region 107 and a second impurity region 109 may be formed in the active area AA, a plurality of assistance layers 111 may be formed on the first impurity region 107 and the second impurity region 109, a gate top conductive layer 207 may be formed on the gate structure 200, and a first dielectric layer 501 may be formed over the substrate 101 and the isolation layer 103.

With reference to FIGS. 10 and 11, an implantation process may be performed using the gate structure 200 and the plurality of gate spacers 205 as masks to form the first impurity region 107 and the second impurity region 109. The first impurity region 107 and the second impurity region 109 may be respectively correspondingly formed adjacent to two sides of the gate structure 200 and in the active area AA. The width W1 of the first impurity region 107 may be greater than the width W2 of the second impurity region 109.

The dopants of the implantation process may be, for example, phosphorus, arsenic, antimony, or boron. In some embodiments, the concentration of dopants of the first impurity region 107 and the second impurity region 109 may be between about $4\times10^{20}$ atoms/cm$^3$ and about $2\times10^{21}$ atoms/cm$^3$. The concentration of dopants of the first impurity region 107 and the second impurity region 109 may be greater than the concentration of dopants of the plurality of lightly doped regions 105. The first impurity region 107 and the second impurity region 109 may have an electrical type such as n-type or p-type. The electrical type of the first impurity region 107 or the second impurity region 109 may be the same as the electrical type of the plurality of lightly doped regions 105. An annealing process may be performed to activate the first impurity region 107 and the second impurity region 109. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal.

Figure 12:
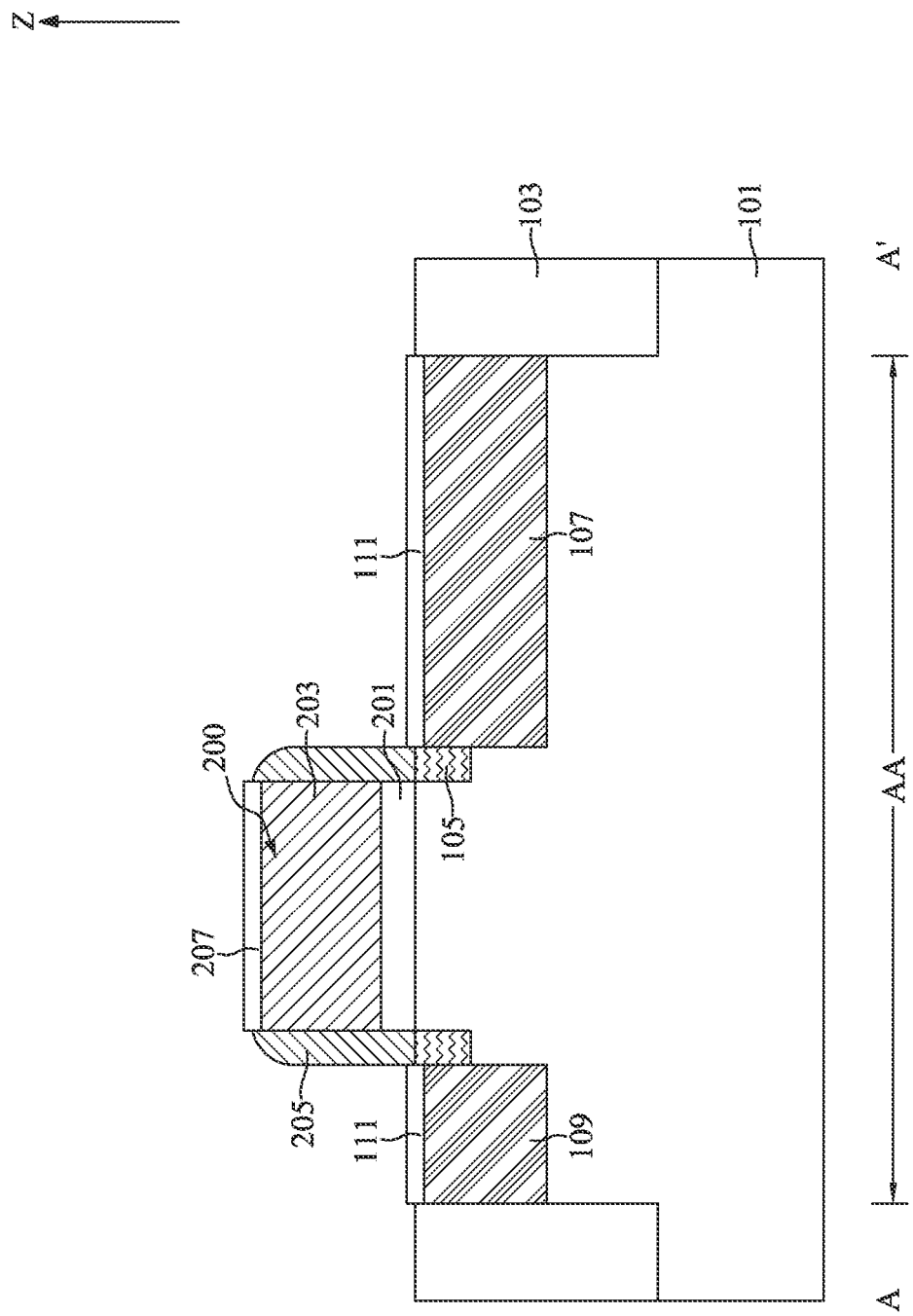
FIGS. 12 to 18 are schematic cross-sectional view diagrams taken along the line A-A' in FIG. 10 illustrating part of a flow for fabricating the semiconductor device in accordance with one embodiment of the present disclosure.

With reference to FIG. 12, a layer of conductive material (not shown) may be conformally formed over the intermediate semiconductor device illustrated in FIG. 11 to cover the first impurity region 107, the second impurity region 109, the gate bottom conductive layer 203, the plurality of gate spacers 205, and the isolation layer 103. The conductive material may include, for example, titanium, nickel, platinum, tantalum, or cobalt.

A thermal treatment may be subsequently performed. During the thermal treatment, metal atoms of the layer of conductive material may react chemically with silicon atoms of the first impurity region 107, the second impurity region 109, and the gate bottom conductive layer 203 to form the plurality of assistance layers 111 and the gate top conductive layer 207, respectively and correspondingly. The plurality of assistance layers 111 and the gate top conductive layer 207 may include titanium silicide, nickel silicide, nickel platinum silicide, tantalum silicide, or cobalt silicide. The thermal treatment may be a dynamic surface annealing process. After the thermal treatment, a cleaning process may be performed to remove the unreacted conductive material. The cleaning process may use etchant such as hydrogen peroxide and an SC-1 solution. The plurality of assistance layers 111 and the gate top conductive layer 207 may have a thickness between about 2 nm and about 20 nm and may serve as ohmic contact to reduce the contact resistance of the first impurity region 107, the second impurity region 109, and the gate bottom conductive layer 203.

Figure 13:
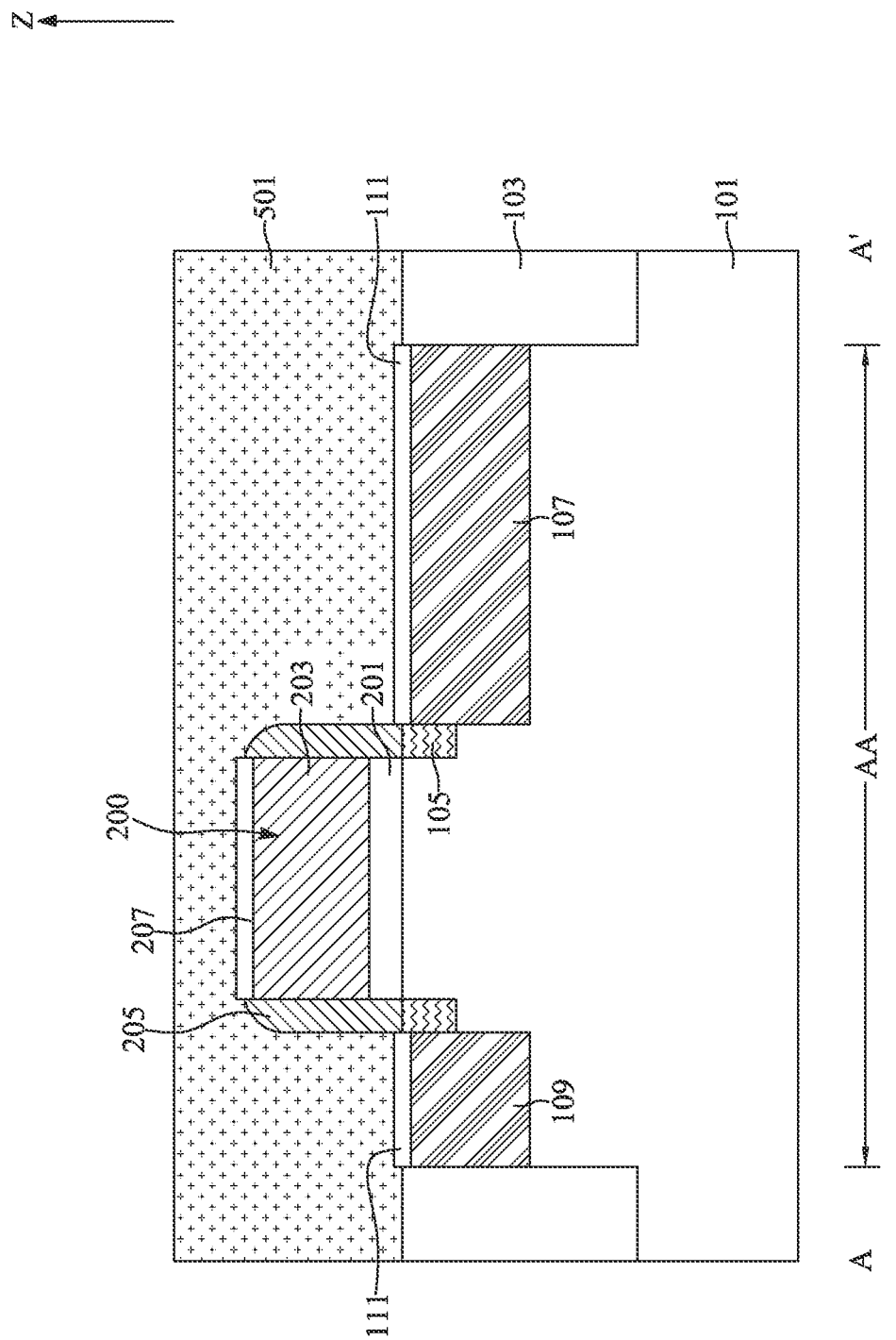

With reference to FIG. 13, the first dielectric layer 501 may be formed over the intermediate semiconductor device illustrated in FIG. 12 to cover the plurality of assistance layers 111, the gate top conductive layer 207, the plurality of gate spacers 205, and the isolation layer 103. A planarization process, such as chemical mechanical polishing, may be performed to remove excess material and provide a substantially flat surface for subsequent processing steps. The first dielectric layer 501 may be formed by, for example, chemical vapor deposition, plasma enhanced chemical vapor deposition, or the like. In some embodiments, the first dielectric layer 501 may be deposited using a silicate or silicon source, a number of doping sources, and an ozone source. The doping sources may be, for example, triethylborate, triethylphosphate, triethyphosphite, trimethylphosphate, or trimethylphosphite. The silicate or silicon source may be, for example, tetramethylorthosilicate. The doping sources may result in impurity atoms such as phosphorus or boron in the first dielectric layer 501. In some embodiments, the first dielectric layer 501 may be formed without any doping sources.

With reference to FIG. 1 and FIGS. 14 to 18, at step S17, a first contact 301, a second contact 303, a third contact 305, and a gate contact 307 may be formed in the first dielectric layer 501.

Figure 14:
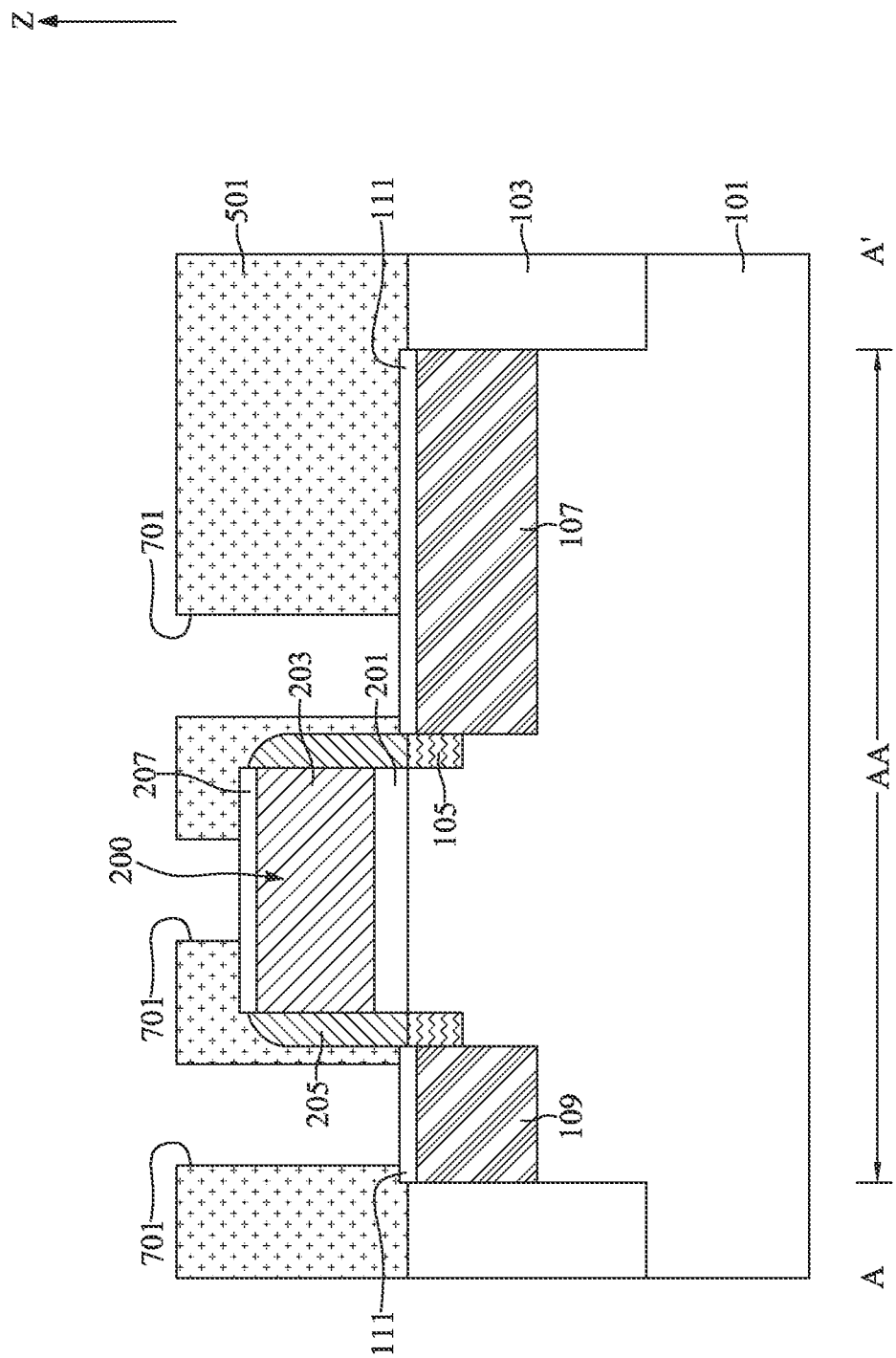

With reference to FIG. 14, a mask layer (not shown) may be formed on the first dielectric layer 501 to define the positions and the patterns of the second contact 303, the third contact 305, and the gate contact 307. An etch process, such as an anisotropic dry etch process, may be performed to form a plurality of first openings 701. In some embodiments, sidewalls of the plurality of first openings 701 may be substantially vertical. The plurality of assistance layers 111 and the gate top conductive layer 207 may be respectively correspondingly exposed by the plurality of first openings 701.

It should be noted that, in the description of the present disclosure, a surface is "substantially vertical" if there exists a vertical plane from which the surface does not deviate by more than three times the root mean square roughness of the surface.

Figure 15:
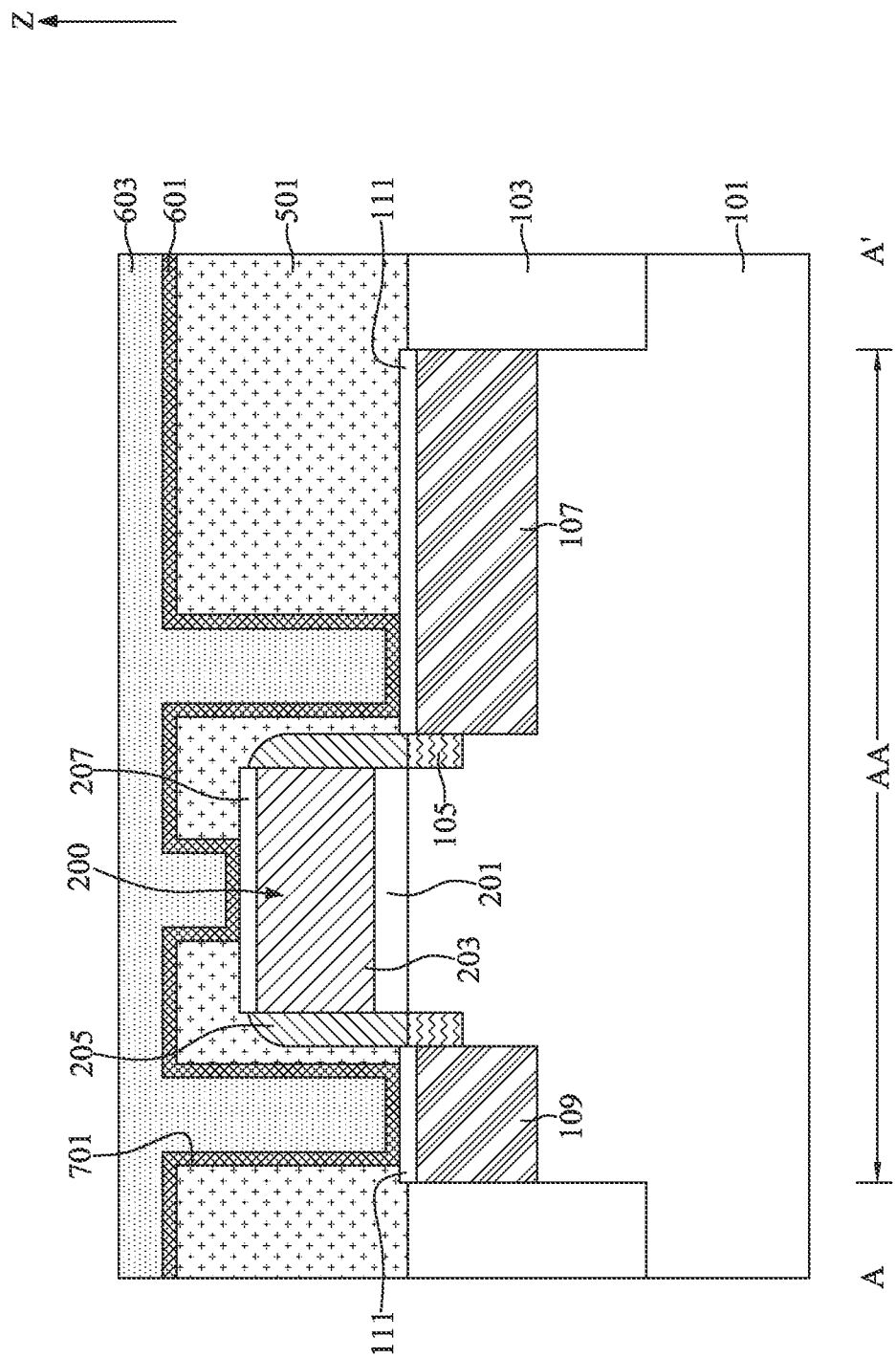

With reference to FIG. 15, a layer of barrier material 601 may be conformally formed in the plurality of first openings 701 and on the top surface of the first dielectric layer 501. The layer of barrier material 601 may include, for example, titanium nitride.

In some embodiments, the layer of barrier material 601 may be formed by chemical vapor deposition. Specifically, the formation of the layer of barrier material 601 may include a source gas introducing step, a first purging step, a reactant flowing step, and a second purging step. The source gas introducing step, the first purging step, the reactant flowing step, and the second purging step may be referred to as one cycle. Multiple cycles may be performed to obtain the desired thickness of the layer of barrier material 601.

The intermediate semiconductor device illustrated in FIG. 14 may be loaded in a reaction chamber and may be pre-heated to a determined temperature. In the source gas introducing step, source gases containing a precursor and a reductant may be introduced to the reaction chamber. It should be noted that the precursor and the reductant may be injected using different inlet valves but are not limited thereto. The precursor may diffuse across the boundary layer and reach the surface of the intermediate semiconductor device illustrated in FIG. 14 (i.e., the top surface of the first dielectric layer 501 and the inner walls of the plurality of first openings 701). The precursor may adsorb on and subsequently migrate on the surface aforementioned. The adsorbed precursor may react with the reductant on the surface aforementioned and form solid byproducts and gaseous byproducts. The solid byproducts may form nuclei on the surface aforementioned. The nuclei may grow into islands and the islands may merge into a continuous thin film on the surface aforementioned. In the first purging step, a purge gas such as argon may be injected into the reaction chamber to purge out the gaseous byproducts, unreacted precursor, and unreacted reductant.

In the reactant flowing step, the reactant may be solely introduced to the reaction chamber to turn the continuous thin film formed on the surface aforementioned. In the second purging step, a purge gas such as argon may be injected into the reaction chamber to purge out the gaseous byproducts and unreacted reactant.

For example, the precursor may be titanium tetrachloride. The reductant may be hydrogen gas. The reactant may be ammonia. In the source gas introducing step, titanium tetrachloride and the hydrogen gas may react on the surface and form a titanium film and gaseous hydrogen chloride. In the reactant flowing step, ammonia may react with the titanium film formed on the surface aforementioned to form the layer of barrier material 601 formed of titanium nitride.

In some embodiments, the formation of the layer of barrier material 601 using chemical vapor deposition may be performed with assistance of plasma. The source of the plasma may be, for example, argon, hydrogen, or a combination thereof.

In some embodiments, the layer of barrier material 601 may be formed by atomic layer deposition such as photo-assisted atomic layer deposition or liquid injection atomic layer deposition. Specifically, the formation of the layer of barrier material 601 may include a first precursor introducing step, a first purging step, a second precursor introducing step, and a second purging step. The first precursor introducing step, the first purging step, the second precursor introducing step, and the second purging step may be referred to as one cycle. Multiple cycles may be performed to obtain the desired thickness of the layer of barrier material 601.

Specifically, the intermediate semiconductor device illustrated in FIG. 14 may be loaded in a reaction chamber. In the first precursor introducing step, a first precursor may be introduced to the reaction chamber. The first precursor may diffuse across the boundary layer and reach the surface of the intermediate semiconductor device illustrated in FIG. 14. The first precursor may adsorb on the surface aforementioned to form a monolayer at a single atomic layer level. In the first purging step, a purge gas such as argon may be injected into the reaction chamber to purge out unreacted first precursor.

In the second precursor introducing step, a second precursor may be introduced to the reaction chamber. The second precursor may react with the monolayer and turn the monolayer into the layer of barrier material 601. In the second purging step, a purge gas such as argon may be injected into the reaction chamber to purge out unreacted second precursor and gaseous byproduct. Comparing to the chemical vapor deposition, a particle generation caused by a gas phase reaction may be suppressed because the first precursor and the second are separately introduced.

For example, the first precursor may be titanium tetrachloride. The second precursor may be ammonia. Adsorbed titanium tetrachloride may form a titanium monolayer. The ammonia in the second precursor introducing step may react with the titanium monolayer and turn the titanium monolayer into the layer of barrier material 601.

In some embodiments, the formation of the layer of barrier material 601 using atomic layer deposition may be performed with assistance of plasma. The source of the plasma may be, for example, argon, hydrogen, oxygen, or a combination thereof. In some embodiments, the oxygen source may be, for example, water, oxygen gas, or ozone. In some embodiments, co-reactants may be introduced to the reaction chamber. The co-reactants may be selected from the group consisting of hydrogen, hydrogen plasma, oxygen, air, water, ammonia, hydrazines, alkylhydrazines, boranes, silanes, ozone and a combination thereof.

In some embodiments, the formation of the layer of barrier material 601 may be performed using the following process conditions. The substrate temperature may be between about 160° C. and about 300° C. The evaporator temperature may be about 175° C. The pressure of the reaction chamber may be about 5 mbar. The solvent for the first precursor and the second precursor may be toluene.

With reference to FIG. 15, a layer of conductive material 603 may be formed to fill the plurality of first openings 701. The layer of conductive material 603 may be formed of, for example, chemical vapor deposition, plasma enhanced vapor deposition, sputtering, or the like. The conductive material 603 may be, for example, tungsten, copper, aluminum, or the like.

Figure 16:
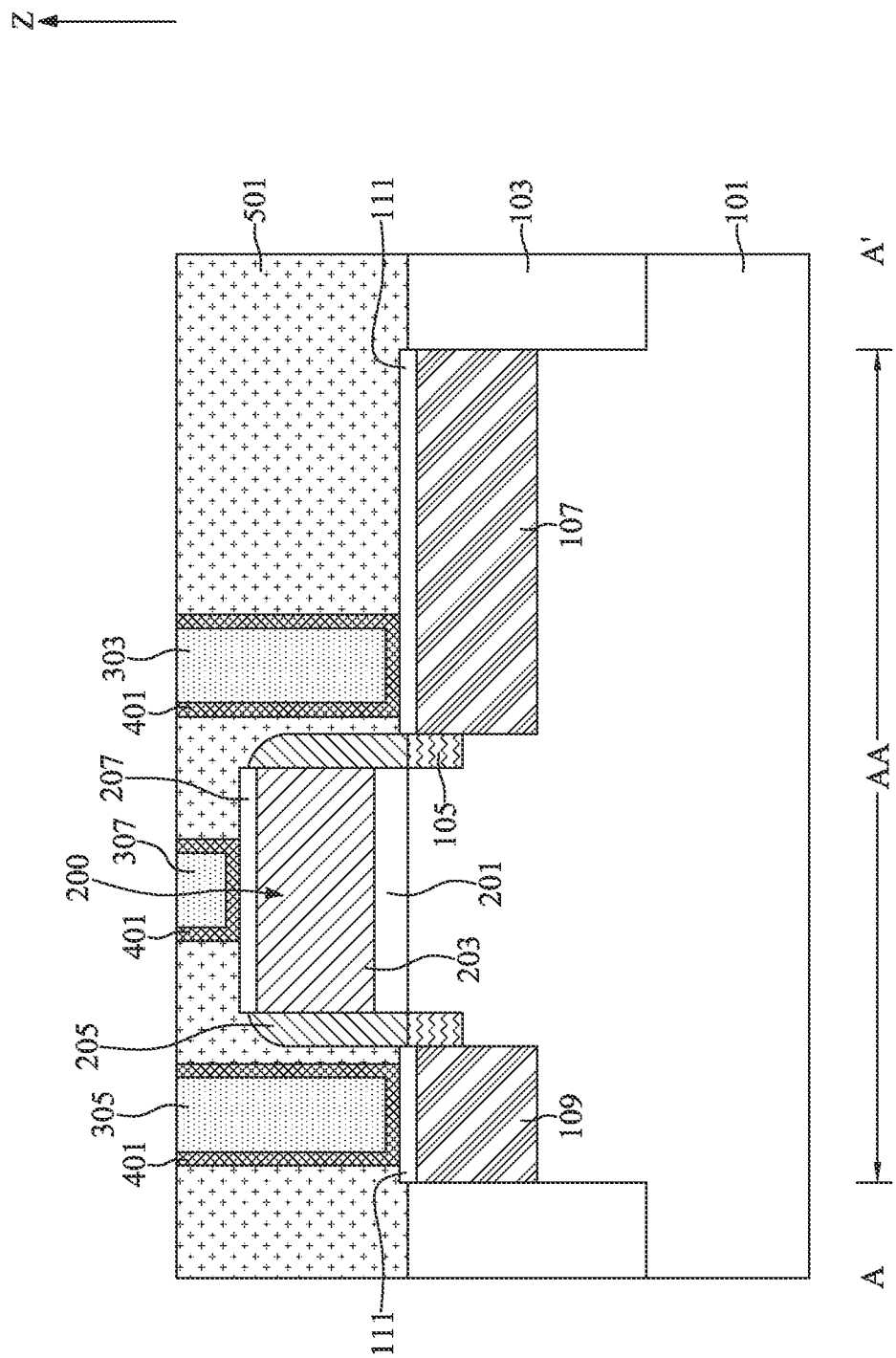

With reference to FIG. 16, a planarization process, such as chemical mechanical polishing, may be performed until the top surface of the first dielectric layer 501 is exposed to remove excess material, provide a substantially flat surface for subsequent processing steps, and concurrently form the second contact 303, the third contact 305, the gate contact 307, and the plurality of barrier layers 401. The second contact 303 may be formed on the first impurity region 107. The third contact 305 may be formed on the second impurity region 109. The gate contact 307 may be formed on the gate bottom conductive layer 203. The second contact 303 and the barrier layer 401 as a whole may have a first resistance.

Figure 17:
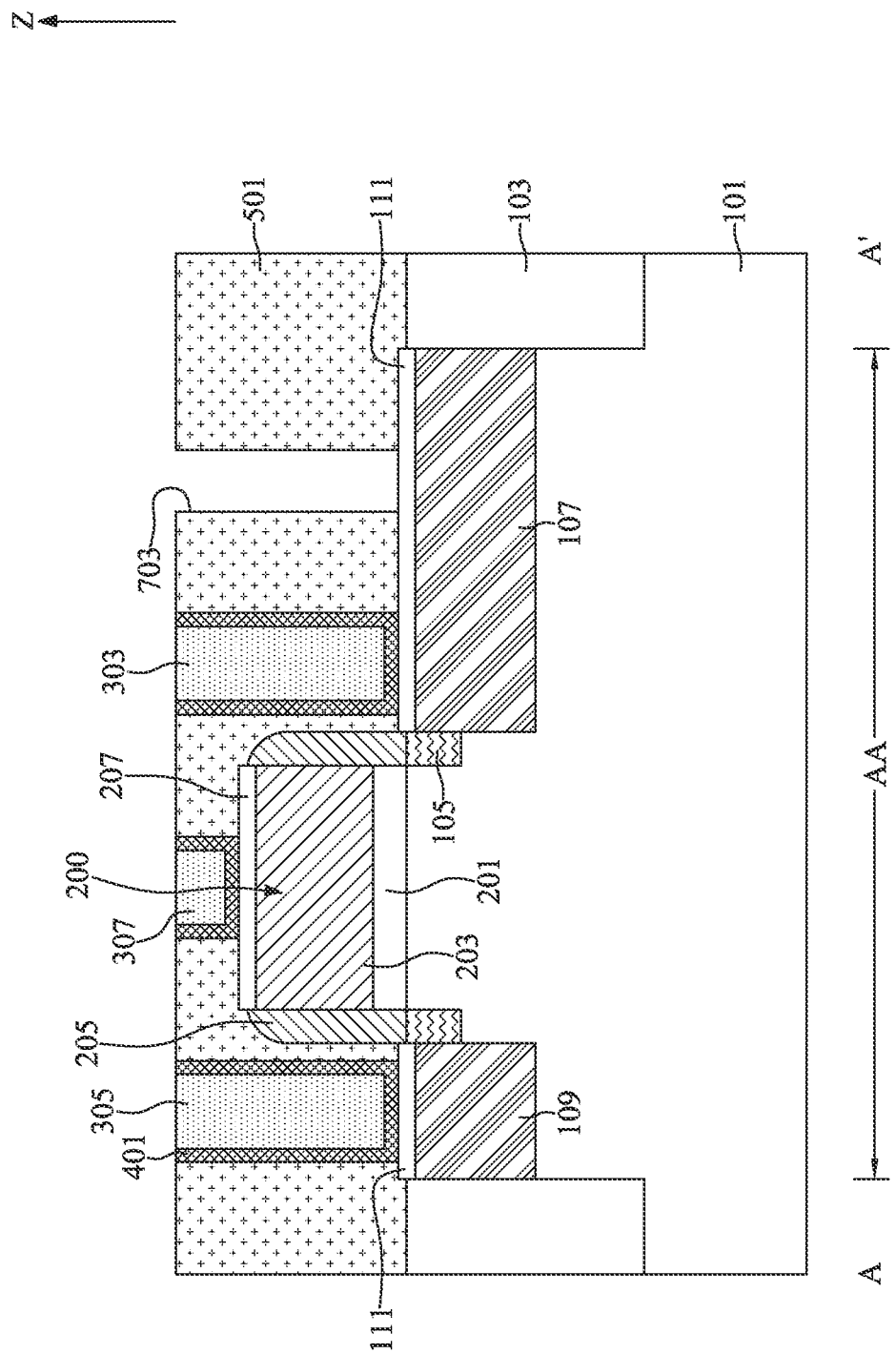

With reference to FIG. 17, a mask layer (not shown) may be formed on the first dielectric layer 501 to define the position and the pattern of the first contact 301. An etch process, such as an anisotropic dry etch process, may be performed to form a second opening 703. In some embodiments, the sidewall of the second opening 703 may be substantially vertical. The assistance layer 111 formed on the first impurity region 107 may be exposed by the second opening 703.

Figure 18:
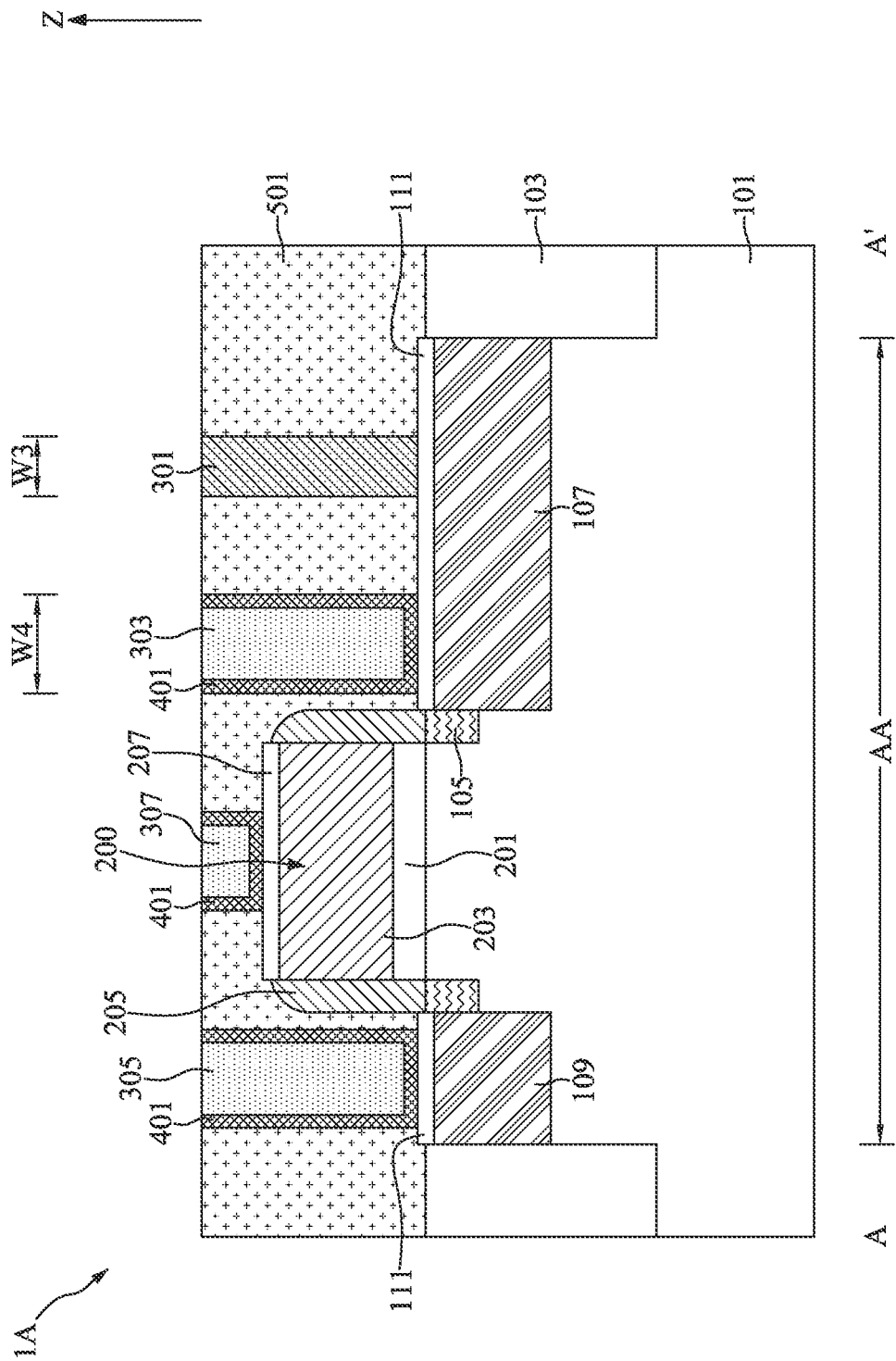

With reference to FIG. 18, a layer of conductive material (not shown) may be formed to fill the second opening 703. The layer of conductive material may be formed of, for example, chemical vapor deposition, plasma enhanced vapor deposition, sputtering, or the like. The conductive material may be, for example, tungsten nitride, polycrystalline silicon, doped polycrystalline silicon, or the like. A planarization process, such as chemical mechanical polishing, may be performed until the top surface of the first dielectric layer 501 is exposed to remove excess material, provide a substantially flat surface for subsequent processing steps, and concurrently form the first contact 301. The first contact 301 may have a width W3 less than a width W4 of the second contact 303. The first contact 301 may be formed on the first impurity region 107. The first contact 301 may have a second resistance. The second resistance of the first contact 301 may be greater than the first resistance of the second contact 303, the third contact 305, or the gate contact 307.

With reference to FIG. 18, the first impurity region 107, the second impurity region 109, the gate structure 200, the first contact 301, the second contact 303, the third contact 305, and the gate contact 307 together configure an inverter. In some embodiments, the substrate 101, the plurality of lightly doped regions 105, and the plurality of barrier layers 401 may be also regarded to as part of the inverter.

Figure 19:
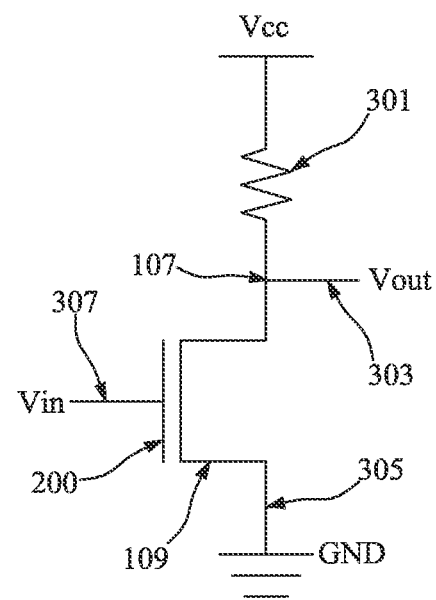
FIG. 19 illustrate, in a schematic circuit diagram, the semiconductor device in accordance with one embodiment of the present disclosure.

FIG. 19 illustrate, in a schematic circuit diagram, the semiconductor device 1A in accordance with one embodiment of the present disclosure.

With reference to FIG. 19, the first contact 301 may be electrically coupled to a power supply Vcc. The second contact 303 may be electrically coupled to a signal output Vout. The third contact 305 may be electrically coupled to a ground potential GND. The gate contact 307 may be electrically coupled to a signal input Vin. The gate structure 200 may be electrically coupled to the signal input Vin through the gate contact 307. The first impurity region 107 may be electrically coupled to the signal output Vout and the power supply Vcc through the second contact 303 and the first contact 301, respectively. The second impurity region 109 may be electrically coupled to the ground potential GND through the third contact 305.

For example, when the signal input Vin is not provided (Vin=0), the current may flow from the power supply Vcc, through the first impurity region 107 and the second contact 303, to the signal output (Vout=1). For another example, when the signal input Vin is provided (Vin=1), the current may flow from the power supply Vcc, through the first impurity region 107, the channel region between the first impurity region 107 and the second impurity region 109, the second impurity region 109, the third contact 305, to the ground potential GND. As a result, the signal output Vout may be absence (Vout=0).

FIGS. 20 to 23 illustrate, in schematic cross-sectional view diagrams, semiconductor devices 1B, 1C, 1D, and 1E in accordance with some embodiments of the present disclosure.

Figure 20:
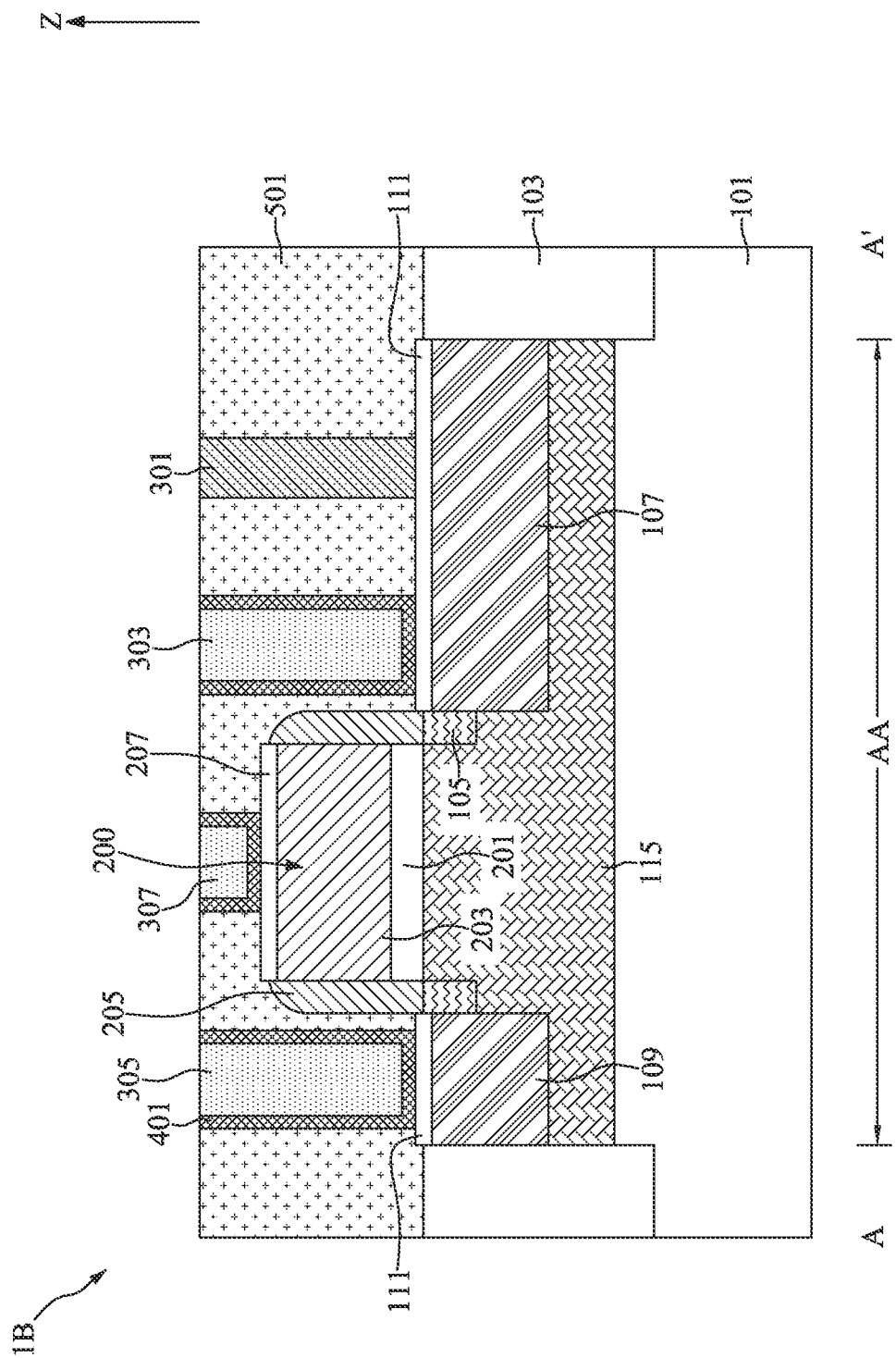
FIGS. 20 to 23 illustrate, in schematic cross-sectional view diagrams, semiconductor devices in accordance with some embodiments of the present disclosure.

With reference to FIG. 20, the semiconductor device 1B may have a structure similar to that illustrated in FIG. 18. The same or similar elements in FIG. 20 as in FIG. 18 have been marked with similar reference numbers and duplicative descriptions have been omitted.

With reference to FIG. 20, a well layer 115 may be disposed in the active area AA of the substrate 101. The plurality of lightly doped regions 105, the first impurity region 107, the second impurity region 109 may be disposed in the well layer 115. The well layer 115 may be doped with dopants such as phosphorus, arsenic, antimony, or boron. The concentration of dopants of the well layer 115 may be less than the concentration of dopants of the plurality of lightly doped regions 105. The well layer 115 may have an electrical type different from that of the first impurity region 107.

Figure 21:
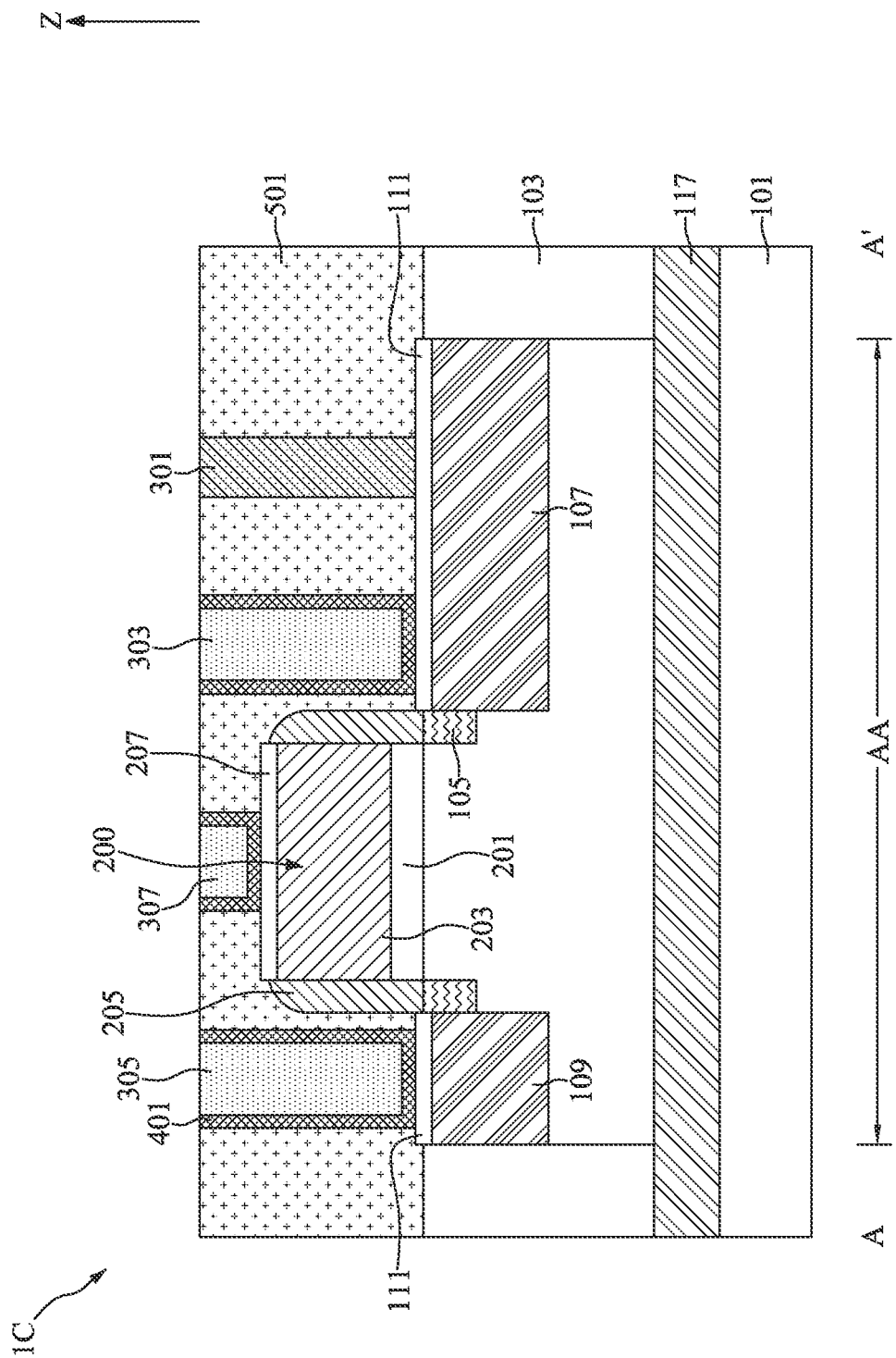

With reference to FIG. 21, the semiconductor device 1C may have a structure similar to that illustrated in FIG. 18. The same or similar elements in FIG. 21 as in FIG. 18 have been marked with similar reference numbers and duplicative descriptions have been omitted.

With reference to FIG. 21, a buried insulation layer 117 may be disposed in the substrate 101. The first impurity region 107 and the second impurity region 109 may be disposed above the buried insulation layer 117. In some embodiments, the buried insulation layer 117 may be a crystalline or non-crystalline dielectric material such as an oxide and/or nitride. In one example, the buried insulation layer 117 may be a dielectric oxide such as, for example, silicon dioxide. In another example, the buried insulation layer 117 may be a dielectric nitride such as, for example, silicon nitride or boron nitride. In yet another example, the buried insulation layer 117 may include a stack of a dielectric oxide and a dielectric nitride. Specifically, a stack of, in any order, silicon dioxide and silicon nitride or boron nitride may be employed as the buried insulation layer 117. The buried insulation layer 117 may have a thickness from 10 nm to 200 nm, although other thicknesses that are lesser than, or greater than, the aforementioned thickness range may also be employed as the thickness of the buried insulation layer 117. The buried insulation layer 117 may reduce the leakage current between the first impurity region 107 and the second impurity region 109.

Figure 22:
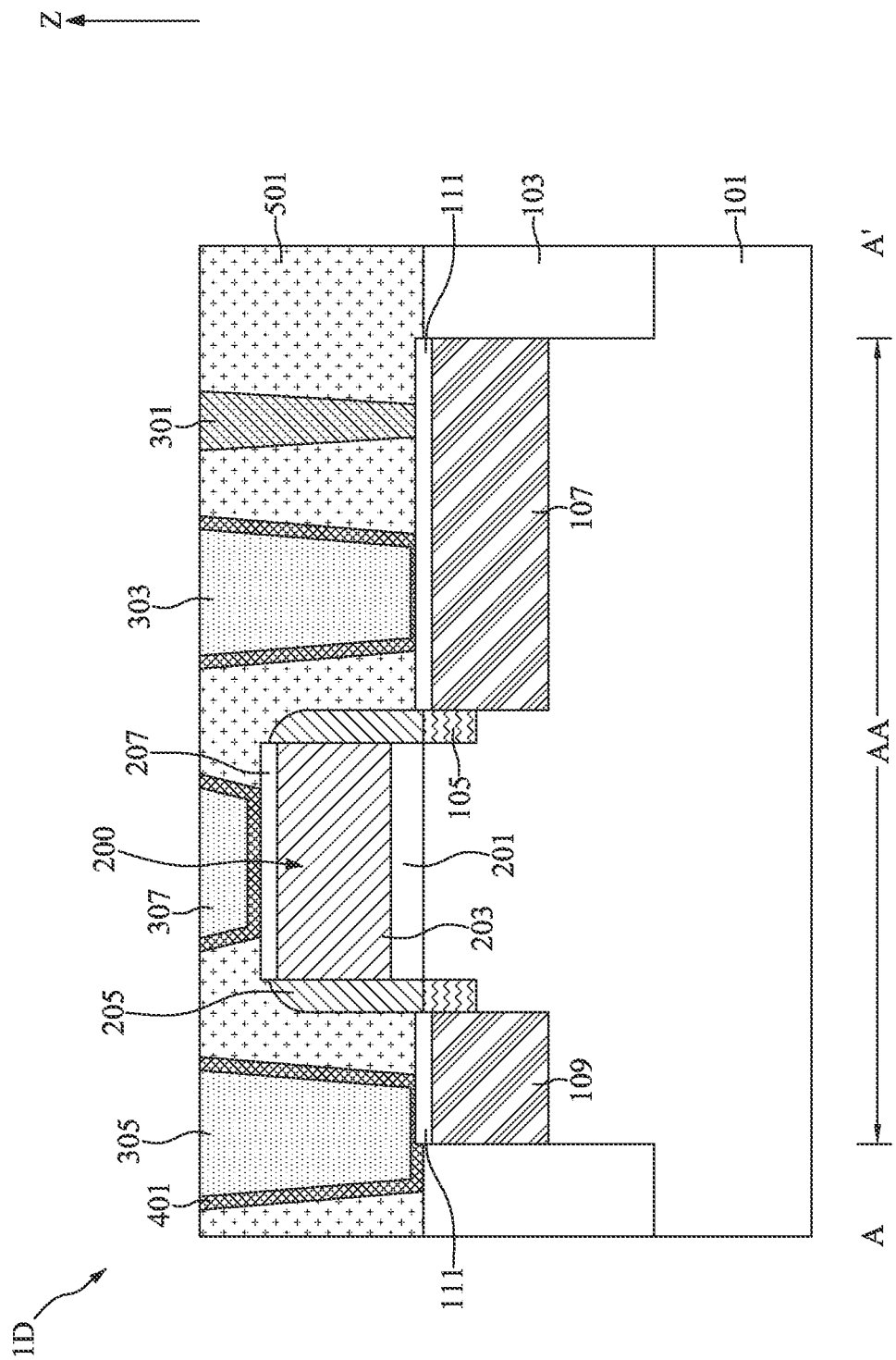

With reference to FIG. 22, the semiconductor device 1D may have a structure similar to that illustrated in FIG. 18. The same or similar elements in FIG. 21 as in FIG. 18 have been marked with similar reference numbers and duplicative descriptions have been omitted. The sidewalls of the first contact 301, the second contact 303, the third contact 305, and the gate contact 307 may be tapered.

Figure 23:
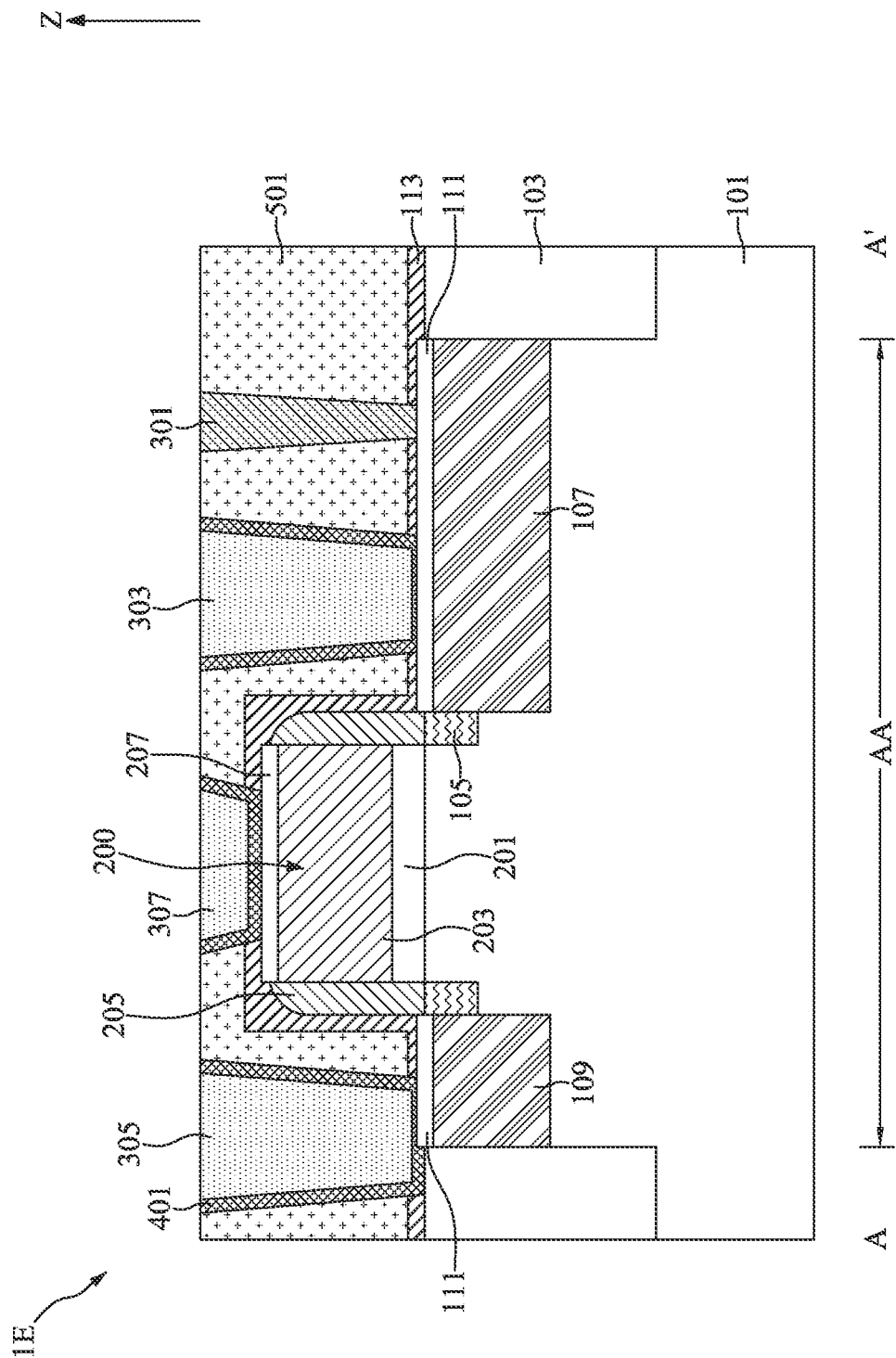

With reference to FIG. 23, the semiconductor device 1E may have a structure similar to that illustrated in FIG. 22. The same or similar elements in FIG. 23 as in FIG. 22 have been marked with similar reference numbers and duplicative descriptions have been omitted.

With reference to FIG. 23, a capping layer 113 may be disposed to cover the active area AA of the substrate 101, the isolation layer 103, the plurality of assistance layers 111, the plurality of gate spacers 205, and the gate top conductive layer 207. The capping layer 113 may be formed of, for example, silicon oxide, silicon nitride, silicon oxynitride, silicon nitride oxide, other semiconductor oxides, other semiconductor nitrides, or a combination thereof. The first contact 301, the second contact 303, the third contact 305, and the gate contact 307 may disposed along the capping layer 113 to contacting the plurality of assistance layers 111 and the gate top conductive layer 207, respectively and correspondingly.

FIGS. 24 to 28 illustrate, in schematic cross-sectional view diagrams, a flow for fabricating a semiconductor device IF in accordance with another embodiment of the present disclosure.

Figure 24:
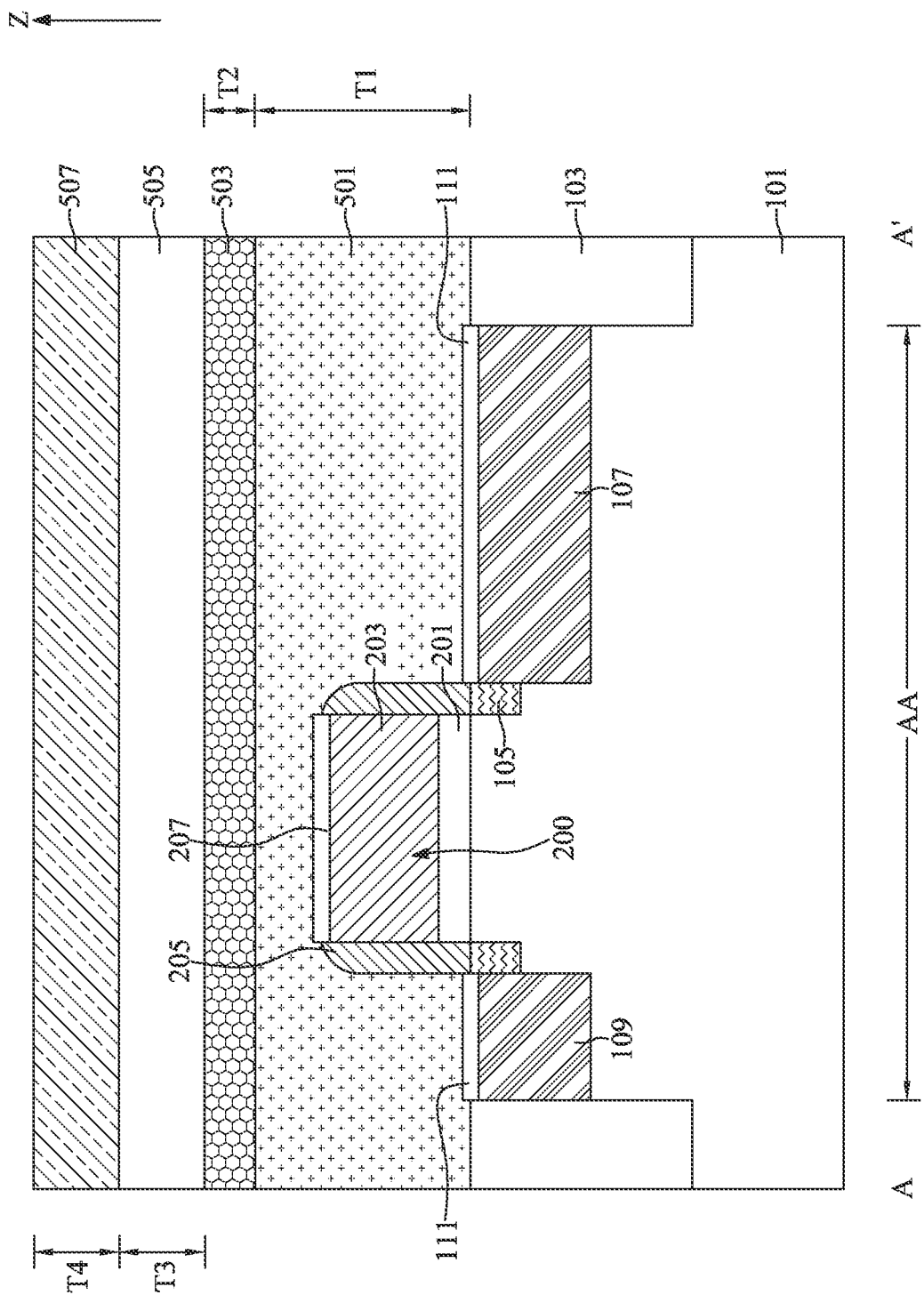
FIGS. 24 to 28 illustrate, in schematic cross-sectional view diagrams, a flow for fabricating a semiconductor device in accordance with another embodiment of the present disclosure.

With reference to FIG. 24, an intermediate semiconductor device may be fabricated with a procedure similar to that illustrated in FIGS. 2 to 13. The first dielectric layer 501 may include impurity atoms such as phosphorus or boron. The first dielectric layer 501 may have a thickness T1.

With reference to FIG. 24, a second dielectric layer 503 may be formed on the first dielectric layer 501. In some embodiments, the second dielectric layer 503 may have a thickness T2 less than a thickness T1 of the first dielectric layer 501. The second dielectric layer 503 may be formed by, for example, chemical vapor deposition, plasma enhanced chemical vapor deposition. In some embodiments, the second dielectric layer 503 may be deposited using a silicate or silicon source, a number of doping sources, and an ozone source. The doped sources may be, for example, triethylborate, triethylphosphate, triethyphosphite, trimethylphosphate, or trimethylphosphite. The silicate or silicon source may be, for example, tetramethylorthosilicate. The doping sources may result in impurity atoms such as phosphorus or boron in the second dielectric layer 503. In some embodiments, the doping sources of the first dielectric layer 501 and the doping sources of the second dielectric layer 503 may be the same. As a result, the first dielectric layer 501 and the second dielectric layer 503 may include the same impurity atoms. In some embodiments, the concentration of atoms of the second dielectric layer 503 may be greater than the concentration of atoms of the first dielectric layer 501.

With reference to FIG. 24, a third dielectric layer 505 may be formed on the second dielectric layer 503. In some embodiments, the third dielectric layer 505 may have a thickness T3 which is greater than the thickness T2 of the second dielectric layer 503. In some embodiments, the thickness T3 of the third dielectric layer 505 may be greater than or equal to the thickness T1 of the first dielectric layer 501. In some embodiments, the third dielectric layer 505 may be formed by, for example, chemical vapor deposition, plasma enhanced chemical vapor deposition. In some embodiments, the third dielectric layer 505 may be deposited using a silicate or silicon source, a number of doping sources, and an ozone source. The doped sources may be, for example, triethylborate, triethylphosphate, triethyphosphite, trimethylphosphate, or trimethylphosphite. The silicate or silicon source may be, for example, tetramethylorthosilicate. The doping sources may result in impurity atoms such as phosphorus or boron in the third dielectric layer 505. In some embodiments, the doping sources of the third dielectric layer 505 and the doping sources of the second dielectric layer 503 may be different. As a result, the third dielectric layer 505 and the second dielectric layer 503 may include different impurity atoms.

With reference to FIG. 24, a fourth dielectric layer 507 may be formed on the third dielectric layer 505. In some embodiments, the fourth dielectric layer 507 may have a thickness T4 greater than or equal to the thickness T3 of the third dielectric layer 505. The thickness T4 of the fourth dielectric layer 507 may be greater than the thickness T2 of the second dielectric layer 503. The fourth dielectric layer 507 may be formed by, for example, chemical vapor deposition, plasma enhanced chemical vapor deposition. In some embodiments, the fourth dielectric layer 507 may be deposited using a silicate or silicon source, a number of doping sources, and an ozone source. The doping sources may be, for example, triethylborate, triethylphosphate, triethyphosphite, trimethylphosphate, or trimethylphosphite. The silicate or silicon source may be, for example, tetramethylorthosilicate. The doping sources may result in impurity atoms such as phosphorus or boron in the fourth dielectric layer 507. In some embodiments, the doping sources of the fourth dielectric layer 507 and the doping sources of the third dielectric layer 505 may be the same. As a result, the fourth dielectric layer 507 and the third dielectric layer 505 may include the same impurity atoms. In some embodiments, the concentration of atoms of the fourth dielectric layer 507 may be greater than the concentration of atoms of the third dielectric layer 505.

Figure 25:
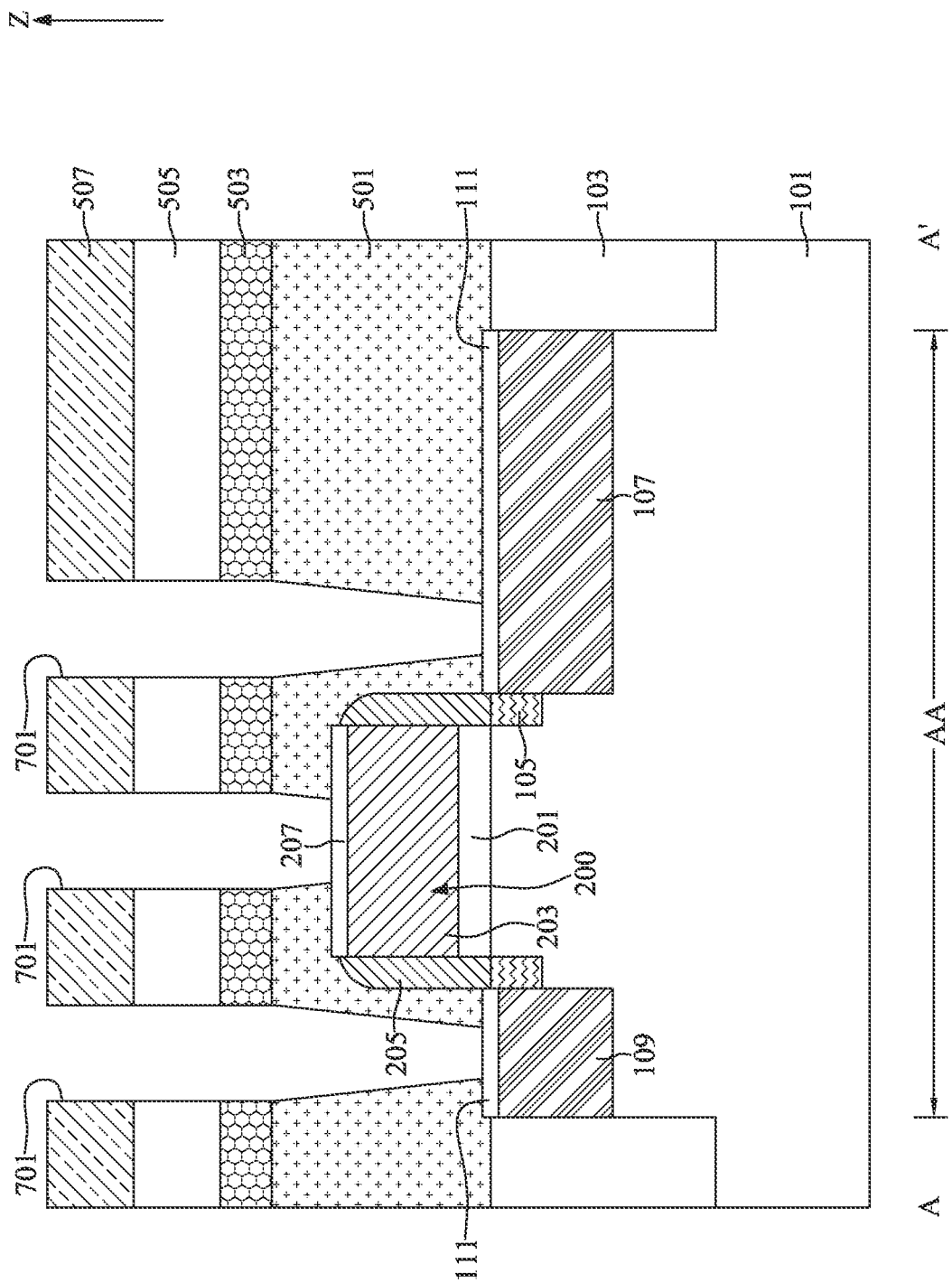

With reference to FIG. 25, a mask layer (not shown) may be formed on the fourth dielectric layer 507 to define the positions and the patterns of the second contact 303, the third contact 305, and the gate contact 307. An etch process, such as an anisotropic dry etch process, may be performed to form the plurality of first openings 701.

Due to the concentration of atoms of dielectric layers may affect the etching behavior during the etch process so as to determine the profile of first openings 701. By using different concentration of atoms of dielectric layers and different stack configuration of the dielectric layer, first openings 701 with different sidewall profiles among the dielectric layers may be formed. Generally, dielectric layer with low concentration of atoms may result in tapered sidewall profile. Dielectric layer with high concentration of atoms may result in substantially vertical sidewall profile.

For brevity, clarity, and convenience of description, only one first opening 701 is described. The first opening 701 may be formed along the fourth dielectric layer 507, the third dielectric layer 505, the second dielectric layer 503, and the first dielectric layer 501. The sidewall of the first opening 701 consisting of the fourth dielectric layer 507, the third dielectric layer 505, and the second dielectric layer 503 may be substantially vertical. The sidewall of the first opening 701 consisting of the first dielectric layer 501 may be tapered.

Figure 26:
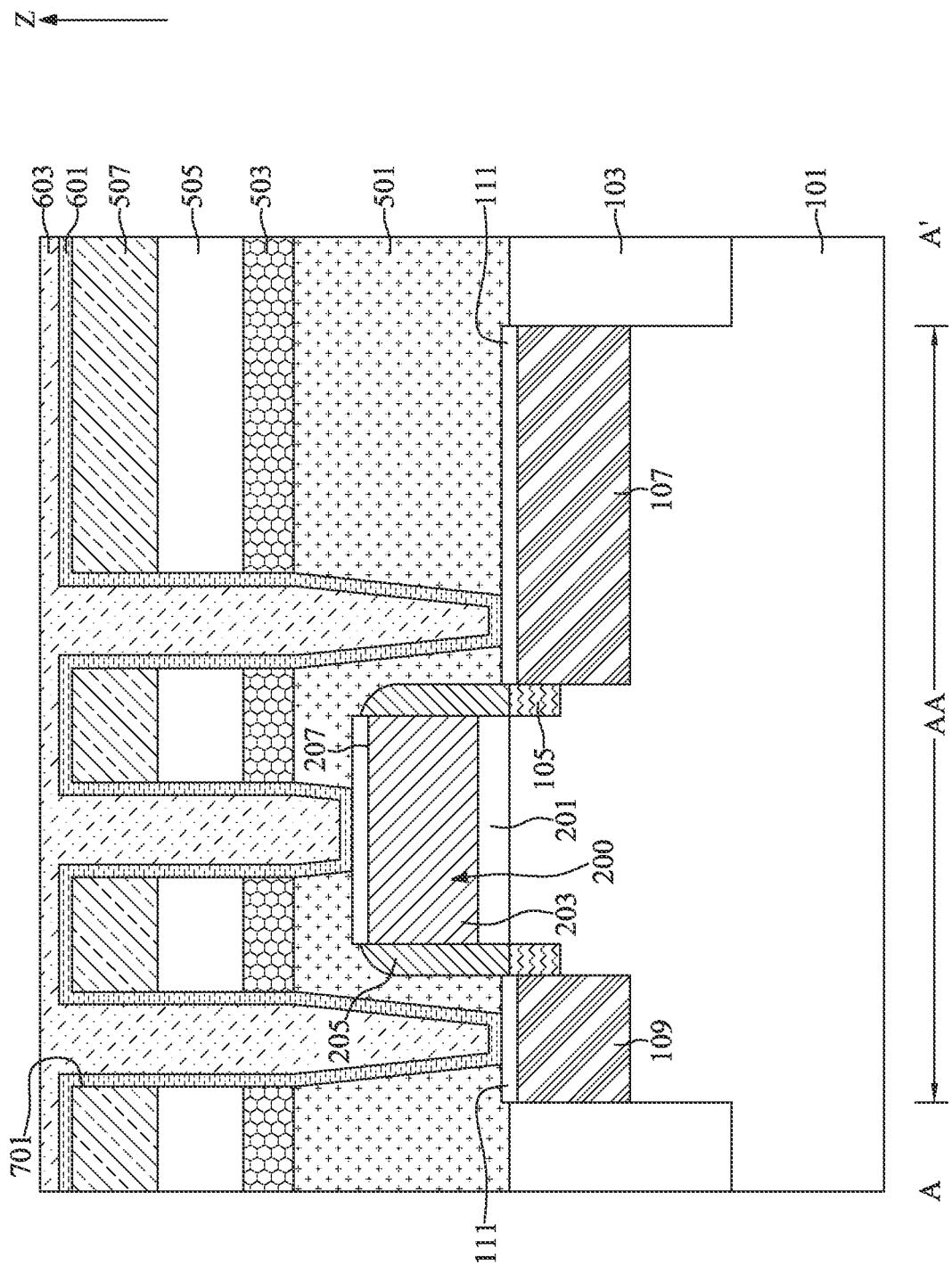

With reference to FIG. 26, the layer of barrier material 601 and the layer of conductive material 603 may be formed in the plurality of first openings 701 with a procedure similar to that illustrated in FIG. 15, and descriptions thereof are not repeated herein.

Figure 27:
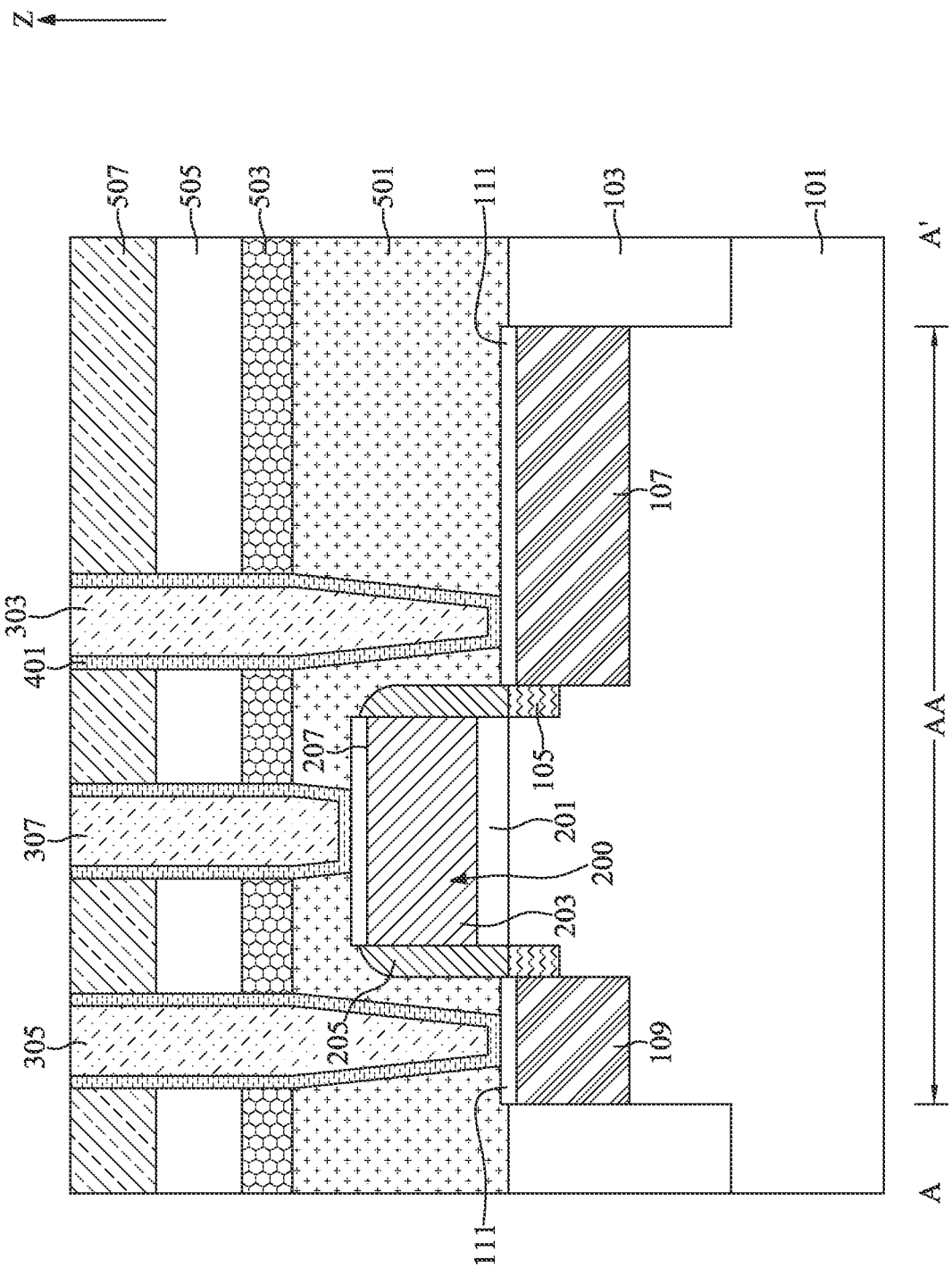

With reference to FIG. 27, a planarization process, such as chemical mechanical polishing, may be performed until the top surface of the fourth dielectric layer 507 is exposed to remove excess material, provide a substantially flat surface for subsequent processing steps, and concurrently form the second contact 303, the third contact 305, the gate contact 307, and the plurality of barrier layers 401.

Figure 28:
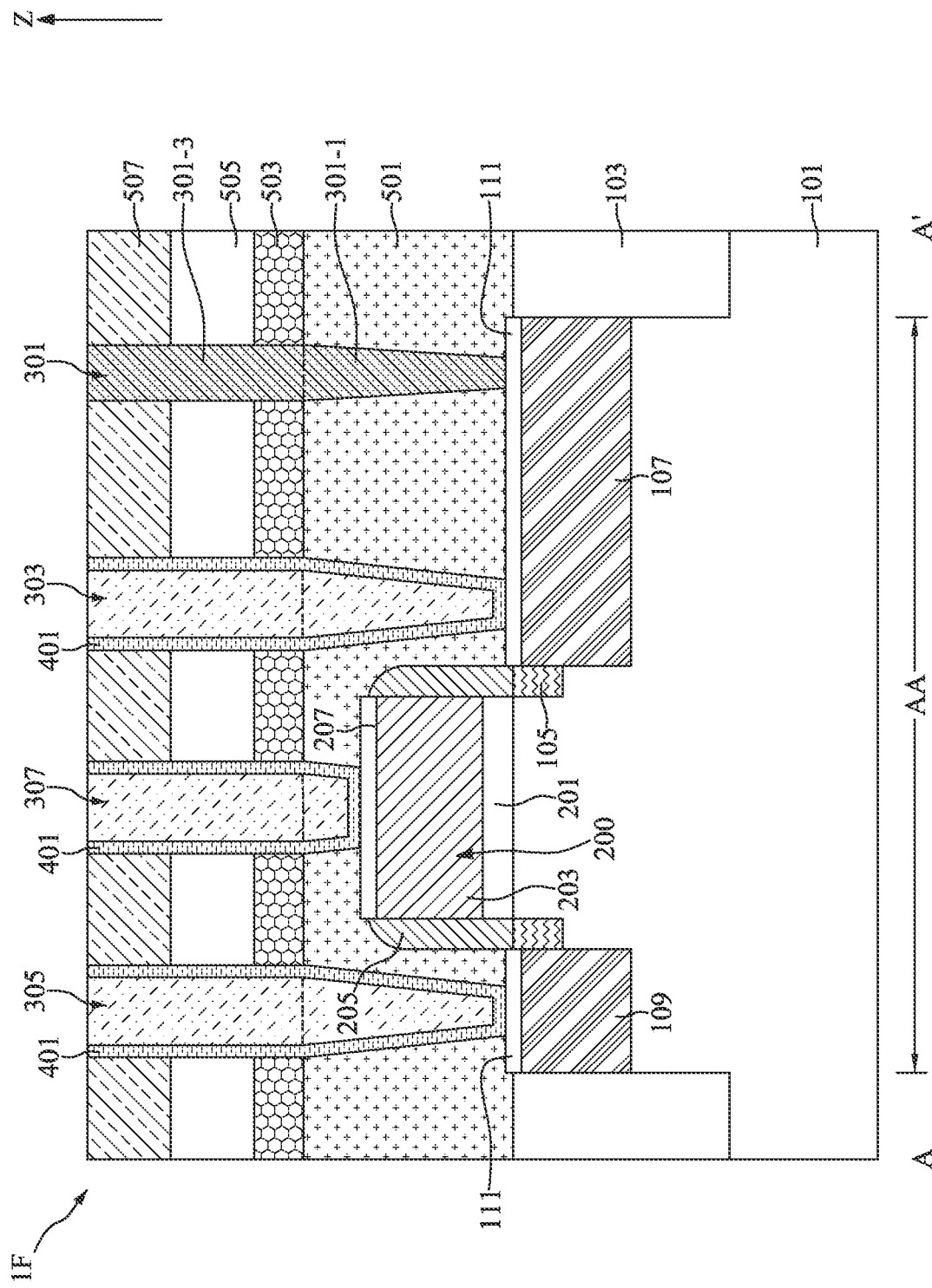

With reference to FIG. 28, the first contact 301 may be formed with a procedure similar to that illustrated in FIGS. 17 and 18, and descriptions thereof are not repeated herein. The first contact 301 may include a lower portion 301-1 and an upper portion 301-3. The upper portion 301-3 may be disposed along the fourth dielectric layer 507, the third dielectric layer 505, and the second dielectric layer 503. The sidewall profile of the upper portion 301-3 may be substantially vertical. The lower portion 301-1 may be disposed in the first dielectric layer 501. The sidewall profile of the lower portion 301-1 may be tapered. The second contact 303, the third contact 305, and the gate contact 307 may have sidewall profiles similar to the first contact 301, and descriptions thereof are not repeated herein.

One aspect of the present disclosure provides a semiconductor device including a substrate; a gate structure positioned on the substrate; a first impurity region and a second impurity region respectively positioned on two sides of the gate structure and positioned in the substrate; a first contact positioned on the first impurity region and including a first resistance; a second contact positioned on the first impurity region and including a second resistance less than the first resistance of the first contact. The first contact is configured to electrically couple to a power supply and the second contact is configured to electrically couple to a signal output. The gate structure, the first impurity region, the second impurity region, the first contact, and the second contact together configure an inverter.

Another aspect of the present disclosure provides a method for fabricating a semiconductor device including providing a substrate; forming a gate structure on the substrate; forming a first impurity region and a second impurity region respectively on two sides of the gate structure and in the substrate; forming a first contact on the first impurity region and including a first resistance; and forming a second contact on the first impurity region and including a second resistance less than the first resistance of the first contact. The first contact is configured to electrically couple to a power supply and the second contact is configured to electrically couple to a signal output. The gate structure, the first impurity region, the second impurity region, the first contact, and the second contact together configure an inverter.

Due to the design of the semiconductor device of the present disclosure, an inverter may be simply implemented using the first contact 301 having high resistance. The compact design for implementing the inverter can save real estate of the semiconductor device 1A. As a result, the cost of manufacturing the semiconductor device 1A may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:
1. A semiconductor device, comprising:
a substrate;
a gate structure positioned on the substrate;
a first impurity region and a second impurity region respectively positioned on two sides of the gate structure and positioned in the substrate;
a first contact positioned on the first impurity region and comprising a first resistance; and
a second contact positioned on the first impurity region and comprising a second resistance less than the first resistance of the first contact;
wherein the first contact is configured to electrically couple to a power supply and the second contact is configured to electrically couple to a signal output;
wherein the gate structure, the first impurity region, the second impurity region, the first contact, and the second contact together configure an inverter.

2. The semiconductor device of claim 1, wherein the first contact comprises titanium nitride or doped polycrystalline silicon.

3. The semiconductor device of claim 1, wherein the second contact comprises tungsten.

4. The semiconductor device of claim 3, further comprising a barrier layer positioned between the second contact and the first impurity region and positioned on a sidewall of the second contact, wherein the barrier layer comprises tungsten nitride.

5. The semiconductor device of claim 4, wherein a width of the first contact is less than a width of the second contact.

6. The semiconductor device of claim 5, further comprising a third contact positioned on the second impurity region;
   wherein the third contact comprises tungsten;
   wherein the third contact is configured to electrically couple to a ground potential.

7. The semiconductor device of claim 6, further comprising a gate contact positioned on the gate structure;
   wherein the gate contact comprises tungsten;
   wherein the gate contact is configured to electrically couple to a signal input.

8. The semiconductor device of claim 7, further comprising an assistance layer positioned between the first contact and the first impurity region;
   wherein the assistance layer comprises titanium silicide, nickel silicide, nickel platinum silicide, tantalum silicide, or cobalt silicide.

9. The semiconductor device of claim 8, further comprising a plurality of gate spacers on the substrate and positioned on the two sides of the gate structure;
   wherein the plurality of gate spacers comprise silicon nitride, silicon oxide, silicon oxynitride, or silicon nitride oxide.

10. The semiconductor device of claim 9, further comprising a plurality of lightly doped regions positioned in the substrate and under the plurality of gate spacers;
    wherein the plurality of lightly doped regions are doped with phosphorus, arsenic, antimony, or boron.

11. The semiconductor device of claim 10, wherein a width of the first impurity region is greater than a width of the second impurity region.

12. The semiconductor device of claim 11, wherein the gate structure comprises:
    a gate insulation layer positioned on the substrate; and
    a gate bottom conductive layer positioned on the gate insulation layer;
    wherein the gate contact is positioned on the gate bottom conductive layer.

13. The semiconductor device of claim 12, further comprising a gate top conductive layer positioned between the gate contact and the gate bottom conductive layer;
    wherein the gate top conductive layer comprises titanium silicide, nickel silicide, nickel platinum silicide, tantalum silicide, or cobalt silicide.

14. The semiconductor device of claim 1, wherein a sidewall of the first contact is substantially vertical.

15. The semiconductor device of claim 1, further comprising a capping layer positioned on the substrate and covering the gate structure.

16. The semiconductor device of claim 1, wherein a sidewall of the first contact is tapered.

17. The semiconductor device of claim 1, further comprising a well layer positioned in the substrate;
    wherein the first impurity region and the second impurity region are positioned in the well layer.

18. The semiconductor device of claim 1, further comprising a buried insulation layer positioned in the substrate;
    wherein the first impurity region and the second impurity region are positioned above the buried insulation layer.

19. A method for fabricating a semiconductor device, comprising:
    providing a substrate;
    forming a gate structure on the substrate;
    forming a first impurity region and a second impurity region respectively on two sides of the gate structure and in the substrate;
    forming a first contact on the first impurity region and comprising a first resistance; and
    forming a second contact on the first impurity region and comprising a second resistance less than the first resistance of the first contact;
    wherein the first contact is configured to electrically couple to a power supply and the second contact is configured to electrically couple to a signal output;
    wherein the gate structure, the first impurity region, the second impurity region, the first contact, and the second contact together configure an inverter.

20. The method for fabricating the semiconductor device of claim 19, wherein the first contact comprises titanium nitride or doped polycrystalline silicon and the second contact comprises tungsten.

* * * * *